United States Patent
Eichenfield et al.

(10) Patent No.: US 12,112,236 B1
(45) Date of Patent: Oct. 8, 2024

(54) RECONFIGURABLE PHONONIC DEVICES FOR CLASSICAL AND QUANTUM PROCESSING SYSTEMS

(71) Applicant: National Technology & Engineering Solutions of Sandia, LLC, Albuquerque, NM (US)

(72) Inventors: Matt Eichenfield, Albuquerque, NM (US); Daniel Beom Soo Soh, Pleasanton, CA (US); Eric Chatterjee, Sammamish, WA (US); Jeffrey Charles Taylor, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 526 days.

(21) Appl. No.: 17/506,749

(22) Filed: Oct. 21, 2021

Related U.S. Application Data

(60) Provisional application No. 63/107,500, filed on Oct. 30, 2020.

(51) Int. Cl.
| | |
|---|---|
| *G06N 10/00* | (2022.01) |
| *B82Y 10/00* | (2011.01) |
| *G02F 1/11* | (2006.01) |
| *H10N 30/20* | (2023.01) |
| *H10N 60/80* | (2023.01) |

(52) U.S. Cl.
CPC ............ *G06N 10/00* (2019.01); *G02F 1/11* (2013.01); *H10N 30/20* (2023.02); *H10N 60/80* (2023.02); *B82Y 10/00* (2013.01)

(58) Field of Classification Search
CPC ............ H10N 60/80; B82Y 10/00; G02F 1/11
See application file for complete search history.

(56) References Cited

U.S. PATENT DOCUMENTS

| | | | |
|---|---|---|---|
| 7,110,628 B2 * | 9/2006 | Wong | G02B 6/1225 |
| | | | 385/129 |
| 2002/0021878 A1 * | 2/2002 | Allan | G02F 1/011 |
| | | | 385/144 |

OTHER PUBLICATIONS

Andersen, U. L. et al., "Hybrid discrete- and continuous-variable quantum information," Nature Physics (2015) 11:713-719.
Andrews, R. W. et al., "Bidirectional and efficient conversion between microwave and optical light," Nature Physics (2014) 10:321-326.
Balram, K. C. et al., "Moving boundary and photoelastic coupling in GaAs optomechanical resonators," Optica (2014) 1(6):414-420.
Bochmann, J. et al., "Nanomechanical coupling between microwave and optical photons," Nature Physics (2013) 9:712-.
(Continued)

*Primary Examiner* — Tina M Wong
(74) *Attorney, Agent, or Firm* — Mark A. Dodd

(57) ABSTRACT

Various reconfigurable phononic devices, including phase shifters, mirrors, Mach Zehnder interferometers, memories, and transducers for use in both classical and quantum computing systems are disclosed. The individual phononic devices may be combined in various configurations to implement desired, more complex functionality. The phononic devices may be coupled together to implement the desired functionality using phononic waveguides. The phononic devices include one or more phase shifters that are operationally based on either hyperelasticity or a moving boundary effect.

8 Claims, 17 Drawing Sheets

(56) References Cited

OTHER PUBLICATIONS

Chan, J., "Laser cooling of an optomechanical crystal resonator to its quantum ground state of motion," Thesis, California Institute of Technology, Pasadena, California (2012) 140 pages.

Chan, J. et al., "Optimized optomechanical crystal cavity with acoustic radiation shield," Applied Physics Letters (2012) 101:081115, 4 pages.

Coma, A. et al., "Electrically driven electron spin resonance mediated by spin-valley-orbit coupling in a silicon quantum dot," NPJ Quantum Information (2018) 4:6, 7 pages.

Dahmani, Y. D. et al., "Piezoelectric Transduction of a Wavelength-Scale Mechanical Waveguide," Physical Review Applied (2020 13:024069, 14 pages.

Eichenfield, M. et al., "Optomechanical crystals," Nature (2009) 462:78-82.

Eichenfield, M. et al., "A picogram- and nanometre-scale photonic-crystal optomechanical cavity," Nature (2009) 459:550-555.

Eisert, J. et al., "Distilling Gaussian States with Gaussian Operations is Impossible," Physical Review Letters (2002) 89(13):137903-1-137903-4.

Gardiner, C. W. et al., "Input and output in damped quantum systems: Quantum stochastic differential equations and the master equation," Physical Review A (1985) 31(6):3761-3774.

Genoni, M. G. et al., "Quantifying non-Gaussianity for quantum information," Physical Review A (2010) 82:052341, 19 pages.

Guimond, P.-O. et al., "Chiral quantum optics with V-level atoms and coherent quantum feedback," Physical Review A (2016) 94:033829, 13 pages.

Higginbotham, A. P. et al., "Harnessing electro-optic correlations in an efficient mechanical converter," Nature Physics (2018) 14:1038-1043.

Johnson, B. R. et al., "Quantum non-demolition detection of single microwave photons in a circuit," Nature Physics (2010) 6:663-667.

Kindel, W. F. et al., "Generation and efficient measurement of single photons from fixed-frequency superconducting qubits," Physical Review A (2016) 93:033817, 8 pages.

Krause, A. G., "Acceleration Sensing, Feedback Cooling, and Nonlinear Dynamics with Nanoscale Cavity-Optomechanical Devices," Thesis, California Institute of Technology, Pasadena, California (2015) 135 pages.

Lin, C.-M. et al., "Micromachined One-Port Aluminum Nitride Lamb Wave Resonators Utilizing the Lowest-Order Symmetric Mode," Journal of Microelectromechanical Systems (2014) 23(1):78-91.

Lindner, N. H. et al., "Proposal for Pulsed On-Demand Sources of Photonic Cluster State Strings," Physical Review Letters (2009) 103:113602, 4 pages.

Lodahl, P. et al., "Chiral quantum optics," Nature (2017) 541:473-480.

Lund, A. P. et al., "Fault-tolerant linear optical quantum computing with small-amplitude coherent states," Phys. Rev. Lett (2008) 100:030503.

Maccabe, G. S. et al., "Phononic bandgap nano-acoustic cavity with utralong phonon lifetime," Science (2020) 370:840-843, arXiv:1901.04129.

Meenehan, S. M. et al., "Silicon optomechanical crystal resonator at millikelvin temperatures," Physical Review A (2014) 90:011803(R), 5 pages.

Meenehan, S. M. et al., Supplementary information for: "Silicon optomechanical crystal resonator at millikelvin temperatures," (2014) 7 pages.

Meenehan, S. M., "Cavity Optomechanics at Millikelvin Temperatures," Thesis, California Institute of Technology, Pasadena, California (2015) 148 pages.

Moores, B. A., et al., "Cavity Quantum Acoustic Device in the Multimode Strong Coupling Regime," Physical Review Letters (2018) 120:227701, 5 pages.

Niemczyk, T. et al., "Circuit quantum eletrodynamics in the ultrastrong-coupling regime," Nature Physics (2010) 6:772-776.

Niset, J. et al., "No-Go Theorem for Gaussian Quantum Error Correction," Physical Review Letters (2009) 102:120501, 4 pages.

Reed, A. P. et al., "Faithful conversion of propagating quantum information to mechanical motion," Nature Physics (2017) 13:1163-1167.

Rosenbaum, T. F. et al., "Metal-insulator transition in a doped semiconductor," Physical Review B (1983) 27 (12):7509-7523.

Safavi-Naeini, A. H. et al., "Electromagnetically induced transparency and slow light with optomechanics," Nature (2011) 472:69-73.

Safavi-Naeini, A. H. eta l., "Proposal for an optomechanical traveling wave phonon-photon translator," New Journal of Physics (2011) 13:013017, 30 pages.

Siddiqui, A. et al., "Lamb Wave Focusing Transducer for Efficient Coupling to Wavelength-Scale Structures in Thin Piezoelectric Films," Journal of Microelectromechanical Systems (2018) 27(6):1054-1070.

Soh, D. et al., "High-fidelity State Transfer Between Leaky Quantum Memories," Phys. Rev. Research (2021) 3:033027, 9 pages, arXiv:2005.13062.

Tanaka. Y. et al., "Dynamic control of the Q factor in a photonic crystal nanocavity," Nature Materials (2007) 6:862-865.

Vainsencher, A. et al., "Bi-directional conversion between microwave and optical frequencies in a piezoelectric optomechanical device," Applied Physics Letters (2016) 109:033107, 4 pages.

Wenner, J. et al., "Catching Time-Reversed Microwave Coherent State Photons with 99.4% Absorption Efficiency," Physical Review Letters (2014) 112:210501, 5 pages.

\* cited by examiner

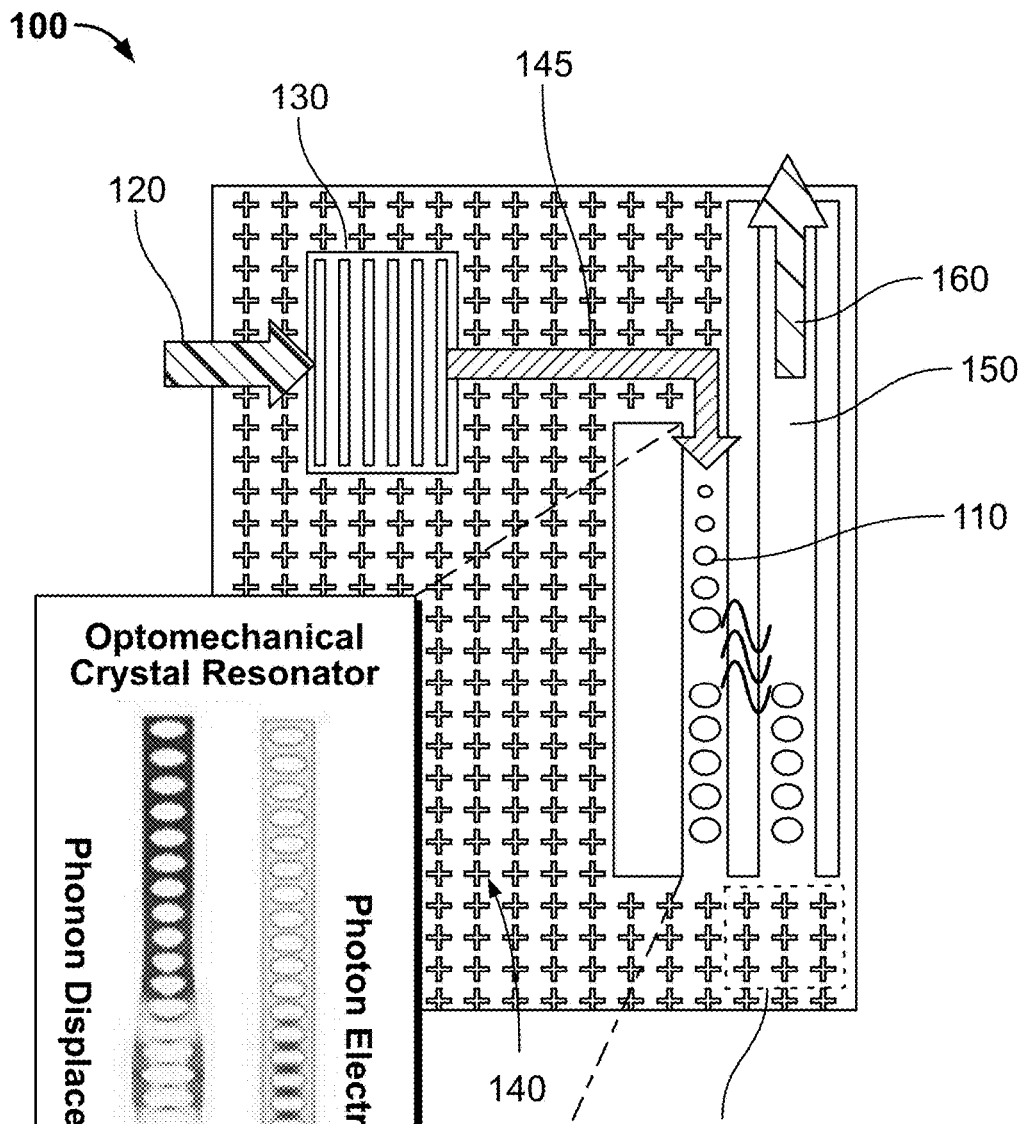
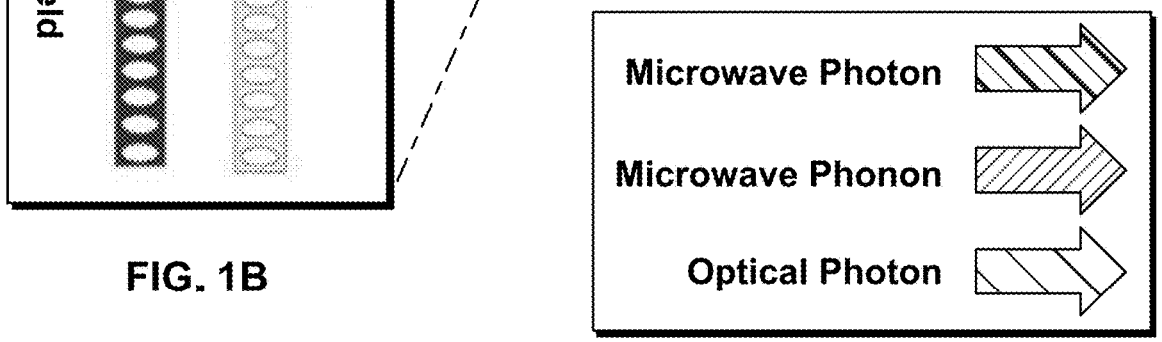
FIG. 1A
FIG. 1B

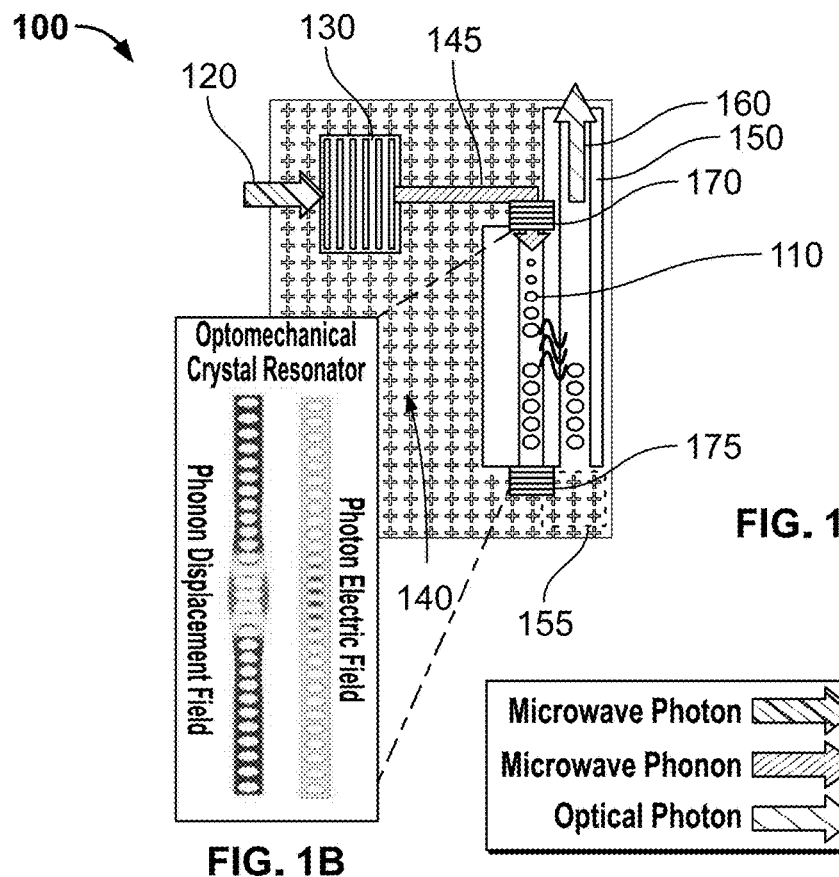
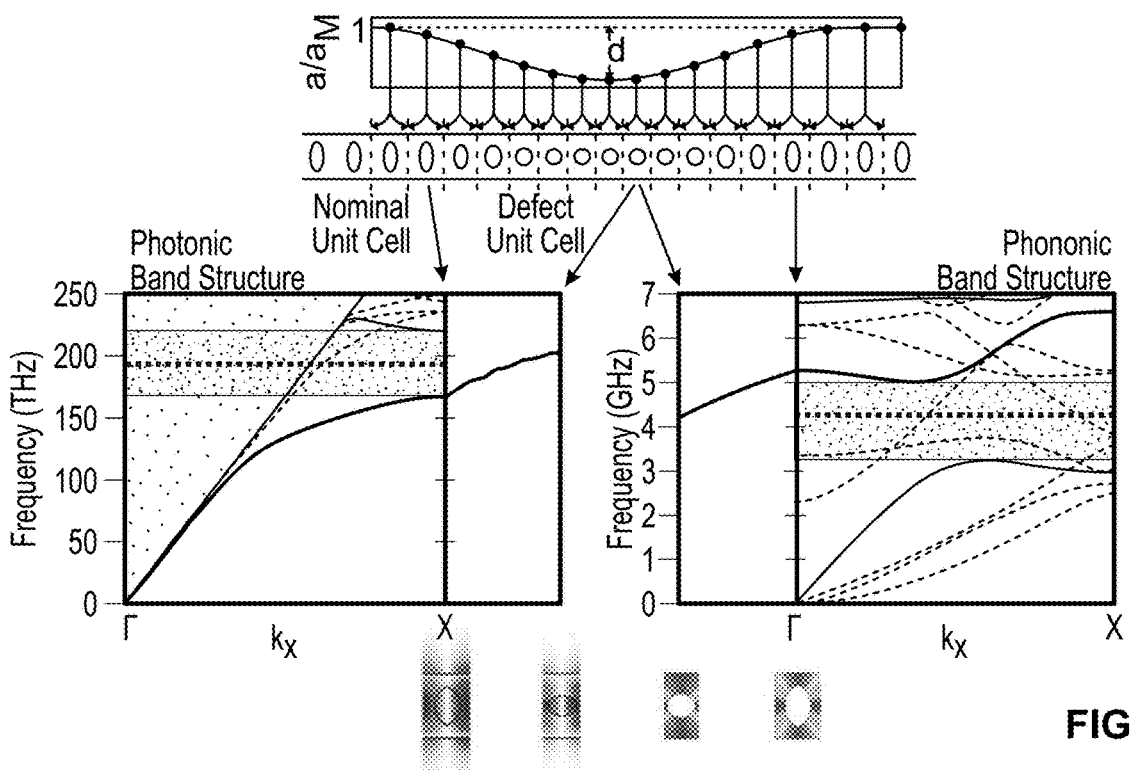

12# RECONFIGURABLE PHONONIC DEVICES FOR CLASSICAL AND QUANTUM PROCESSING SYSTEMS

RELATED APPLICATIONS

This application claims priority to U.S. Provisional Application No. 63/107,500, filed on Oct. 30, 2020, and entitled QUANTUM TRANSDUCTION AND BUFFERING BETWEEN MICROWAVES AND PHOTONS, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to various reconfigurable phononic devices, including phase shifters, mirrors, Mach Zehnder interferometers, and memories, which may be combined in various configurations to implement desired functions in both classical and quantum processing systems.

BACKGROUND

Given the current academic and commercial effort directed into microwave qubit-based quantum information systems, a quantum internet built on existing optical fiber networks will require an efficient interface between telecom band optical photons and microwave photons. In addition, to utilize quantum circuit switching and packet switching protocols, this interface will require a local memory or buffer that allows for quantum information to be transmitted between network nodes without requiring local resources to be immediately available for processing that information.

Several groups have demonstrated conversion between microwave photons and optical photons, but these demonstrated technologies generally suffer from one or more of: low conversion efficiency, high noise, and limited bandwidth.

Proof-of-principle experimental demonstrations of conversion between microwave and optical frequencies exist using the displacement of a micromechanical resonator that simultaneously modulates both the capacitance of a microwave LC resonant circuit and the transmission of a Fabry-Perot optical cavity. This was first performed at 4 K by Andrews in a prototype experiment and by Higginbotham at less than 100 mK in a dilution refrigerator. See R. W. Andrews et al., "Bidirectional and efficient conversion between microwave and optical light," Nature Physics, vol. 10, pp. 321-326 (2014); and A. P. Higginbotham et al, "Harnessing electro-optic correlations in an efficient mechanical converter," Nature Physics, vol. 14, pp. 1038-1043 (2018), the contents of each of which are incorporated herein by reference. Both of these demonstrations used a Fabry-Perot cavity located at the lowest-temperature stage of a cryostat with the optical signal from a laser being free-space coupled to the cavity. The large laser powers used to achieve strong coupling in these systems caused heating in the mechanical mode. For standard sequential transfer protocols, this heating corrupts any desired quantum state transfer. Reed demonstrated a similar but tunable microwave LC resonant circuit coupled to a superconducting microwave qubit, with the microwave quantum information transfer quantified by a fidelity in excess of the classical bound. See A. P. Reed et al., "Faithful conversion of propagating quantum information to mechanical motion," Nature Physics, vol. 13, pp. 1163-1167 (2017), the contents of which are incorporated herein by reference.

Bochmann employed a piezoelectric optomechanical crystal, following the design of Eichenfield's original optomechanical crystal, experimentally demonstrated signal transfer between microwave and optical fields through a localized phonon mode using aluminum nitride as the piezoelectric material. See J. Bochmann et al., "Nanomechanical coupling between microwave and optical photons," Nature Physics, vol. 9, pp. 712-716 (2013); and M. Eichenfield et al., "Optomechanical crystals," Nature, vol. 462, pp. 78-82 (2009), the contents of each of which are incorporated herein by reference. While Bochmann demonstrated electrical to optical conversion in a prototype device, a more recent effort by Vainsencher attempted bi-directional conversion. See A. Vainsencher et al., "Bi-directional conversion between microwave and optical frequencies in a piezoelectric optomechanical device," Applied Physics Letters, vol. 109, article no. 033107 (2016), the contents of which are incorporated herein by reference. Vainsencher noted that bi-directional operation proved challenging due to the difficulty of simultaneously achieving strong electromechanical coupling and sufficient mode-matching to the appropriate microwave frequency mechanical mode. Vainsencher's conclusions included that, although the device holds promise for use as a quantum transducer, the challenge of realizing a sufficient optomechanical coupling rate motivates consideration of other materials such as silicon and gallium arsenide.

An aluminum nitride microdisk resonator was investigated by Balram as a piezo-optomechanical system but was similarly limited by the optomechanical coupling rate. See K. C. Balram et al., "Moving boundary and photoelastic coupling in GaAs optomechanical resonators," Optica, vol. 1, no. 6, pp. 414-420 (2014), the contents of which are incorporated herein by reference. A monolithic implementation in gallium arsenide by Balram realized the combination of the photoelastic effect, which couples localized optical and mechanical modes of the optomechanical crystal, with the piezoelectric effect, which enabled the radio-frequency-driven generation of acoustic waves through an interdigital transducer. In principle, as noted by Moores, this piezoelectric optomechanical device could be integrated with a superconducting microwave qubit device also in gallium arsenide, but the materials and integration challenges would be significant. See B. A. Moores et al., "Cavity quantum acoustic device in the multimode strong coupling regime," Physical Review Letters, vol. 120, article no. 227701 (2018), the contents of which are incorporated herein by reference.

In addition to the fundamental quantum transduction device, a number of supporting phononic (or hybrid photonic/phononic) functions are required. A principal phononic function is phase shifting as a phononic phase shifter is a building block for several functions, including a reconfigurable mirror and a reconfigurable Mach-Zehnder interferometer that can serve as a reconfigurable beam splitter or switch.

In spite of these previous efforts, the need still exists for a high conversion efficiency, low noise, and high bandwidth device that converts between microwave photons and optical photons. The efficient quantum transduction and unique optomechanical crystal resonator of various embodiments of the present invention address all three of these needs.

Various embodiments of the present invention also include phononic building blocks required to build an overall information system.

SUMMARY

One aspect of the present invention relates to a scalable, microfabricated quantum transducer device that provides quantum transduction between microwave quantum information systems and flying optical photon qubits in optical fibers at telecommunications band wavelengths. This quantum transducer device includes a long-lived, local quantum memory/buffer that allows quantum states to be locally stored and transduced in either direction and on-demand using local classical optical control fields. This memory functionality is necessary for microwave-based quantum information systems to function in sophisticated transparent optical networks where switching protocols are used to maximize the utilization of quantum network resources.

With regard to non-Gaussian states, a quantum transducer device in accordance with certain embodiments of the present invention acts as a transducer between itinerant (flying) microwave photons and flying optical photons. This allows the use of very well-established and efficient techniques for creating itinerant non-Gaussian microwave fields using microwave qubits with the ability to measure the properties of the itinerant photon field in the optical domain after the microwave-to-optical transduction. Since the main obstacle to characterization of itinerant non-Gaussian photon states in the microwave domain has been the lack of efficient microwave single photon counters, translation into the optical domain, where single optical photon counters are readily available and highly efficient, provides a new path toward the characterization of these fields. The translation process, through loss and other mechanisms, may impact the fidelity of the non-Gaussian states. However, by using linear amplifiers and quadrature amplitude detectors to do Wigner tomography in the microwave domain and then comparing the results after translation in the optical domain, this provides an excellent tool for studying the transduction process itself.

Further, the quantum transducer device in accordance with certain embodiments of the present invention allows strong, deterministic coupling between a finite-level (discretized) microwave qubit and an ultra-long-lived optomechanical crystal resonator through the electromechanical transducer. This allows for the realization of a hybrid Jaynes-Cummings interaction Hamiltonian between the microwave qubit and the optomechanical crystal resonator, which produces Fock states of the phonon field in the optomechanical crystal resonator. The phonons in the optomechanical crystal resonator can be output directly to flying photon states through the optomechanical interaction. In addition, the phonon states of two sufficiently identical optomechanical crystal resonator can be entangled and teleported via the interaction of flying photon states, which would allow for the non-Gaussian states to be used for their intended purposes, for example, entanglement distillation and testing of Bell inequalities.

An overall quantum information processing system will require additional building blocks to support the quantum transducer device. As the phase of interfering coherent phonons can control routing, storage, and entanglement, certain embodiments of the present invention include a phononic device implementing a phase shifter function. The phononic phase shifter device may, in certain embodiments of the present invention, be used to implement a reconfigurable reflectivity mirror function.

A quantum information processing system will likewise require phononic devices implementing beam splitter, beam mixer, and beam combiner functions, as implemented in certain embodiments of the present invention. By combining phononic devices implementing phase shifting functionality with those implementing beam splitter and beam combiner functionality, a Mach-Zehnder interferometer device may be implemented in yet other embodiments of the present invention.

As memory may be required in some information systems, one or more embodiments of the present invention implement a phononic memory cell, including one that may implement a transducer function that converts phononic information into optical information.

In a first primary embodiment, a device comprises a phononic crystal waveguide (the phononic crystal waveguide carries a phononic signal) and at least one strain actuator (each of the at least one strain actuator induces a strain in the phononic crystal waveguide, the induced strain in the phononic crystal waveguide induces a corresponding phase shift in the phononic signal); the device implements a phase shifter function; a dispersion of the phononic crystal waveguide implements a reconfigurable reflectivity mirror function about an operating frequency in response to the induced strain; the phase shift is caused by at least one of hyperelasticity or a moving boundary effect.

In a second primary embodiment, a device comprises a phononic crystal, the phononic crystal including a phononic beam splitter (the phononic beam splitter receives first and second phononic input signals, couples approximately 50% of the first phononic signal to each of first and second phononic beam splitter outputs, and couples approximately 50% of the second phononic signal to each of first and second phononic beam splitter outputs), a first phononic phase shifter (the first phononic phase shifter coupled to the first phononic beam splitter output and receives a first phononic beam splitter output signal therefrom, the first phononic phase shifter induces a first phase shift in the first phononic beam splitter output signal, and couples the phase shifted first phononic beam splitter output signal to a first phononic phase shifter output), a second phononic phase shifter (the second phononic phase shifter coupled to the second phononic beam splitter output and receives a second phononic beam splitter output signal therefrom, the second phononic phase shifter induces a second phase shift in the second phononic beam splitter output signal, and couples the phase shifted second phononic beam splitter output signal to a second phononic phase shifter output), and a phononic beam combiner (a first input to the phononic beam combiner coupled to the first phononic phase shifter output and receives the first phase shifted first phononic beam splitter output signal therefrom, a second input to the phononic beam combiner coupled to the second phononic phase shifter output and receives the second phase shifted second phononic beam splitter output signal therefrom, the phononic beam combiner couples a first portion of the first phase shifted first phononic beam splitter output signal to a first phononic beam combiner output and a remainder of the first phase shifted first phononic beam splitter output signal to a second phononic beam combiner output, and couples a first portion of the second phase shifted second phononic beam splitter output signal to the first phononic beam combiner output and a remainder of the second phase shifted second phononic beam splitter output signal to the second phononic beam combiner output).

In various embodiments of the second primary embodiment, each of the first and second phononic phase shifters includes a phononic crystal waveguide and at least one strain actuator (each of the at least one strain actuator induces a strain in the phononic crystal waveguide, the induced strain in the phononic crystal waveguide induces a corresponding phase shift in a phononic signal carried by the phononic crystal waveguide); the phase shift is caused by at least one of hyperelasticity or a moving boundary effect; the device implements a reconfigurable Mach-Zehnder phonon interferometer function; the device couples approximately 50% of the first phononic input signal to each of the first and second phononic beam combiner outputs, the device couples approximately 50% of the second phononic input signal to each of the first and second phononic beam combiner outputs, and the device implements a reconfigurable beam mixer function; the device couples approximately 50% of the first phononic input signal to each of the first and second phononic beam combiner outputs and when no second phononic input signal is present, the device implements a reconfigurable beam splitter function; when no second phononic input signal is present, the device implements a reconfigurable beam splitter function; the device couples approximately 100% of the first phononic input signal to the first phononic beam combiner output and approximately 0% of the first phononic input signal to the second phononic beam combiner output, the device couples approximately 100% of the second phononic input signal to the first phononic beam combiner output and approximately 0% of the second phononic input signal to the second phononic beam combiner output, and the device implements a reconfigurable beam combiner function.

In a third primary embodiment, a device comprises a phononic crystal, the phononic crystal including a phononic crystal waveguide (the phononic crystal waveguide carries a phononic signal), a signal I/O port (the signal I/O port located at a first end of the phononic crystal waveguide, the signal I/O port couples the phononic signal into and out of the phononic memory cell for a read or a write process), a phononic mirror (the phononic mirror located at a second end of the phononic crystal waveguide opposite the first end of the phononic crystal waveguide, the phononic mirror reflects the phononic signal), a phononic phase shifter (the phononic phase shifter located adjacent the phononic crystal waveguide, the phononic phase shifter induces a phase shift in the phononic signal), and a phononic nanocavity (the phononic nanocavity located adjacent the phononic crystal waveguide, the phononic nanocavity transfers, stores, and/or exchanges phonons with the phononic crystal waveguide).

In various embodiments of the third primary embodiment, the device implements a phononic memory cell function; the phononic phase shifter includes at least one strain actuator (the strain actuator induces a strain in the phononic crystal waveguide, the induced strain in the phononic crystal waveguide induces the phase shift in the phononic signal carried by the phononic crystal waveguide and reflected by the phononic mirror), the phase shifted phononic signal carried by the phononic crystal waveguide and reflected by the phononic mirror destructively interferes with a phononic signal from the phononic cavity to reduce energy loss from the phononic cavity, and the phase shifted phononic signal carried by the phononic crystal waveguide and reflected by the phononic mirror constructively interferes with a phononic signal from the phononic cavity to enable readout of the phononic cavity; the phase shift is caused by at least one of hyperelasticity or a moving boundary effect; the device further comprises a second phononic phase shifter (the second phononic phase shifter located adjacent the phononic crystal waveguide on a side of the phononic nanocavity opposite the phase shifter, the second phononic phase shifter induces a second phase shift in the phononic signal) and a photonic waveguide (the photonic waveguide located adjacent the phononic crystal waveguide on a side of the phononic nanocavity between the phase shifter and the second phase shifter, the photonic waveguide carries a photonic signal), the phononic nanocavity includes an optomechanical nanocavity, at least a portion of the phononic crystal located between the phononic nanocavity and the photonic waveguide is an optomechanical crystal, the optomechanical crystal has a mechanical bandgap surrounding a frequency of the phononic signal and an optical bandgap surrounding a frequency of the photonic signal; the device implements a phononic memory cell function with an optical readout; the device further comprises an interdigital transducer (the interdigital transducer located adjacent the signal I/O port, the interdigital transducer receives an electromagnetic signal, the interdigital transducer converts the electromagnetic signal into the phononic signal, the interdigital transducer couples the phononic signal to the signal I/O port); the device implements a phononic signal to photonic signal transducer function.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIGS. 1A-1C illustrate quantum transducer devices in accordance with various embodiments of the present invention.

FIG. 2 illustrates an example of a function that can be used to transition the pitch of the holes in an optomechanical crystal resonator to optimize quantum transduction in accordance with one or more embodiments of the present invention.

DETAILED DESCRIPTION

Devices

Figure 3:
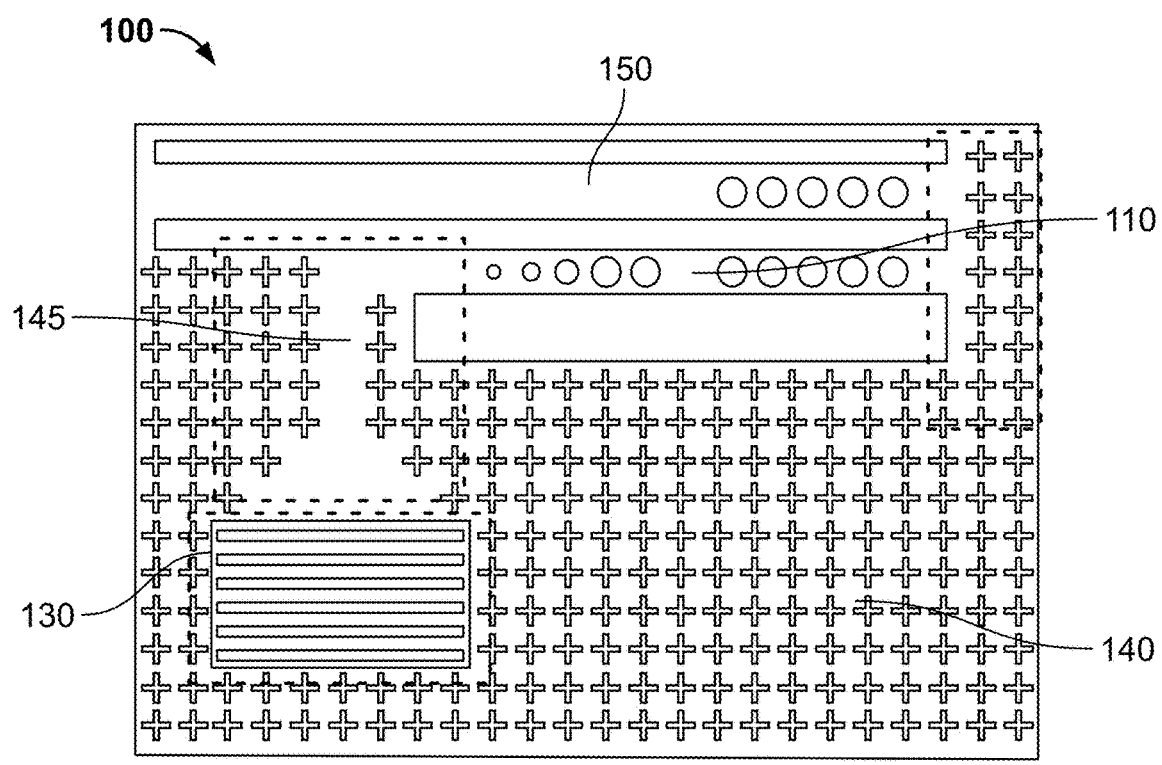
FIG. 3 illustrates a portion of a quantum transducer device in accordance with one or more embodiments of the present invention.

FIG. 1A shows a quantum transducer device 100, in accordance with one or more embodiments of the present invention, which includes a long-lived, local quantum memory/buffer in the form of an optomechanical crystal resonator 110. The optomechanical crystal resonator 110 allows quantum states to be locally stored and transduced in either direction and on-demand using various approaches, including local classical optical control fields or localized strain fields. This memory/buffer functionality is necessary for microwave-based quantum information systems to function in sophisticated transparent optical networks where switching protocols are used to maximize the utilization of quantum network resources.

The quantum transducer device 100 would be in a cryostat adjacent to a microwave quantum information system (QIS), not shown. Operationally, flying microwave photons emitted from the microwave QIS enter the quantum transducer device 100 via an electrical connection 120, for example, a wire bond or a microwave strip line. The electric field from the microwave photons couple to a piezoelectric transducer 130 built on top of a phononic crystal 140, in the form of a suspended single crystal silicon membrane. The electrodes of the piezoelectric transducer 130 create a strain wave via the electric field of the microwave photon, and this results in a traveling wave microwave phonon of the same frequency being emitted into the phononic crystal 140. A phononic crystal waveguide 145 is used to guide the traveling wave microwave phonon from the piezoelectric transducer 130 to the optomechanical crystal resonator 110. Impedance matching of the microwave QIS system and the piezoelectric transducer 130 ensure that the microwave field is not reflected back into the microwave QIS, and geometric changes in the piezoelectric transducer in the direction of propagation allow for additional reflections to be minimized as the phonons are transferred entirely into the phononic crystal 140.

The traveling wave microwave phonon is guided by a fully etched phononic crystal waveguide 145 to the optomechanical crystal resonator 110. The optomechanical crystal resonator 110 has both ultra-high-Q phononic and photonic modes, as shown in FIG. 1B. In particular, the phonon lifetime in the optomechanical crystal resonator 110 can exceed 1 second at gigahertz frequencies. See G. S. MacCabe et al., "Phononic bandgap nano-acoustic cavity with ultralong phonon lifetime," arXiv preprint, article no. 1901.04129 (2019), the contents of which are incorporated herein by reference. Further, the photonic mode within the optomechanical crystal resonator 110 can have quality factors Q exceeding a million at telecommunications frequencies. See A. H. Safavi-Naeini et al., "Electromagnetically induced transparency and slow light with optomechanics," Nature, vol. 472, pp. 69-73 (2011), the contents of which are incorporated herein by reference.

While the very long lifetime and high quality factor Q enable the optomechanical crystal resonator 110 to act as a memory/buffer, getting information into and out of the optomechanical crystal resonator 110 is difficult. To that end, various embodiments of the present invention may employ one, or more, of at least two different methods to decrease the lifetime and lower the Q of the optomechanical crystal resonator 110, thereby enabling information to be transferred into and out of the optomechanical crystal resonator 110. The first of these methods employs local classical optical control fields, while the second employs one or two strain transducers.

Local classical optical control fields applied evanescently by an optical input/output waveguide 150, with a photonic crystal reflector 155 located at one end, allow the phonon mode's frequency to be tuned into and out of resonance with the microwave QIS via the optical spring effect, allowing controllable strong coupling between the microwave QIS and phononic memory. See, M. Eichenfield et al., "A picogram- and nanometre-scale photonic-crystal optomechanical cavity," Nature, vol. 459, pp. 550-555 (2009), the contents of which are incorporated herein by reference. This allows the phonon mode within the optomechanical crystal resonator 110 to be used to store the microwave QIS's state, thereby acting as a memory/buffer. The phonon can be re-emitted to the microwave QIS by tuning it back into resonance with the QIS, or it can be coupled into the optical input/output waveguide 150 as a flying optical photon by reflecting photons of a specific frequency from the optical mode within the optomechanical crystal resonator 110. Thus, the quantum transducer device 100 allows buffered quantum transduction between the microwave photons and optical photons at telecommunications frequencies, which allows them to be coupled, via port 160, to low-loss, single-mode optical fibers for use in existing telecommunications networks. As will be appreciated by those of ordinary skill in the art, the quantum transducer device 100 can be used in reverse to read in optical photons from a fiber network, buffer them locally in the mechanical mode of the optomechanical crystal resonator 110, and deterministically emit them into the microwave QIS system using local classical optical control fields.

To control the resonance mode of the optomechanical crystal resonator 110, and thereby control the flow of information into and out of the optomechanical crystal resonator 110, requires an optical signal having certain properties to be applied to the optical input/output waveguide 150. Specifically, the phononic information may be transferred from one quantum transducer device 100 to another quantum transducer device 100 via an optical fiber using the technique described in Soh et al. See D. Soh et al., "High-fidelity State Transfer Between Leaky Quantum Memories," arXiv preprint, article no. 2005.13062v1 (2020), the contents of which are incorporated herein by reference.

The long lifetime and the high quality factor Q of the optomechanical crystal resonator 110 can also be controlled through the use of one or more strain transducers, as shown in FIG. 1C. A quantum transducer device 100, in accordance with one or more embodiments of the present invention, employs one or more strain transducers. A first strain transducer 170 is located between the optomechanical crystal resonator 110 and the etched phononic crystal waveguide 145 that feeds the optomechanical crystal resonator 110. A second, and optional, strain transducer 175, is located at the opposite end of the optomechanical crystal resonator 110. The first (and optional second) strain transducers 170, 175 are thus preferably located adjacent to either end of the beam that forms the optomechanical crystal resonator 110. By applying a bias to the first (and optional second) strain transducers 170, 175, the phonon mode's frequency within the optomechanical crystal resonator 110 can be tuned into and out of resonance with the microwave QIS, thereby permitting or denying phonon-based information to be transferred between the optomechanical crystal resonator 110 and the microwave QIS. An optical signal is supplied to the optical input/output waveguide 150 to permit the transfer of phonon-to-photon transduced information between the optomechanical crystal resonator 110 and the rest of the system, for example to another quantum transducer device 100 associated with another microwave QIS. One benefit of the strain transducer approach is that it allows for independent optimization of the process for transferring phonon-based information between the optomechanical crystal resonator 110 and the microwave QIS relative to transferring phonon-to-photon transduced information between the optomechanical crystal resonator 110 and the rest of the system.

While the local classical optical control fields and strain transducer approaches to coupling information into and out of the optomechanical crystal resonator 110 have been described in detail, alternative approaches may be possible.

Design and Fabrication

The optomechanical crystal resonator 110 requires the design of a nominal unit cell to act as a mirror, a defect unit cell for co-localization of photons and phonons, and the transition between the two. These unit cell designs are based on band structure simulations and the transition between the two will be a quadratic function that limits radiation losses. FIG. 2 (adapted from J. Chan, "Laser cooling of an optomechanical crystal resonator to its quantum ground state of motion," Ph.D. Dissertation, California Institute of Technology (2012), the contents of which are incorporated herein by reference) illustrates an example of a function that can be used to transition the pitch of the apertures in the optomechanical crystal resonator 110 to optimize quantum transduction. The photonic and phononic band structures are also shown in FIG. 2 for a device operating near an optical frequency of 193 THz and a mechanical frequency of 5 GHz. Various embodiments of the present invention use the same approach illustrated in FIG. 2, where optical and mechanical mode co-localization is accomplished by increasing the frequency for the optical dielectric band at the X-point and decreasing the mechanical breathing mode frequency at the T-point. This occurs in the structure of the optomechanical crystal resonator 110 by simultaneously reducing the aperture pitch and the aspect ratio. Important parameters for the design of the optomechanical crystal resonator 110 include the optical and mechanical frequencies, the optical and mechanical quality factors, and the optomechanical coupling rate. The optomechanical coupling rate defines the optical mode frequency shift due to the zero-point motion of the mechanical oscillator from either the dielectric moving boundary or the photoelastic effect. Design of a silicon optomechanical crystal resonator 110 like that shown in FIG. 2 leads to an optomechanical coupling rate exceeding 1 MHz and is dominated by the photoelastic effect. See, J. Chan et al., "Optimized optomechanical crystal cavity with acoustic radiation shield," Applied Physics Letters, vol. 101, article no. 081115 (2012), the contents of which are incorporated herein by reference. The physical design variables for the optomechanical crystal resonator 110 that enable its optical and mechanical tuning include, but are not limited to, the width and thickness of the beam that forms the optomechanical crystal resonator 110, the size, pitch, and location of the apertures within the optomechanical crystal resonator 110, and the material used to form the optomechanical crystal resonator 110.

As illustrated in FIG. 3, the entire optomechanical crystal cavity 110, the piezoelectric transducer 130, the phononic crystal waveguide 145, and the optical input/output waveguide 150 are located within or adjacent to the phononic crystal 140 for phonon confinement and routing. On the closed side of the optomechanical crystal cavity 110, the phononic crystal 140 acts as a radiation shield to mitigate clamping losses that can greatly reduce the mechanical quality factor of the optomechanical crystal cavity 110. This loss mechanism occurs by unavoidable fabrication imperfections that introduce unconfined mechanical modes of different symmetries.

Figure 4A:
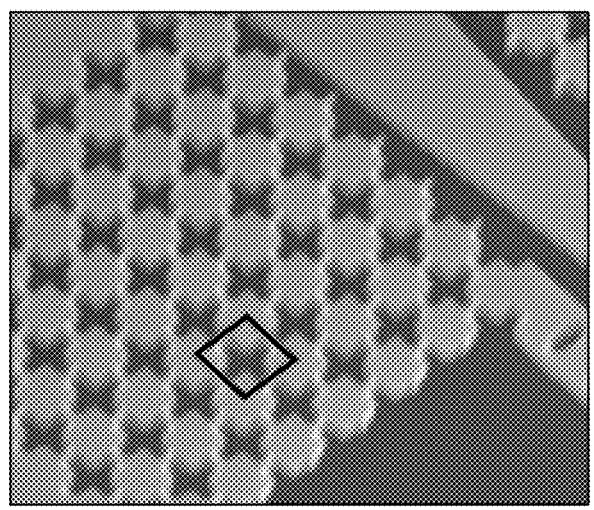
FIGS. 4A and 4B illustrate a phononic crystal and a unit cell thereof in accordance with one or more embodiments of the present invention.
Figure 4B:
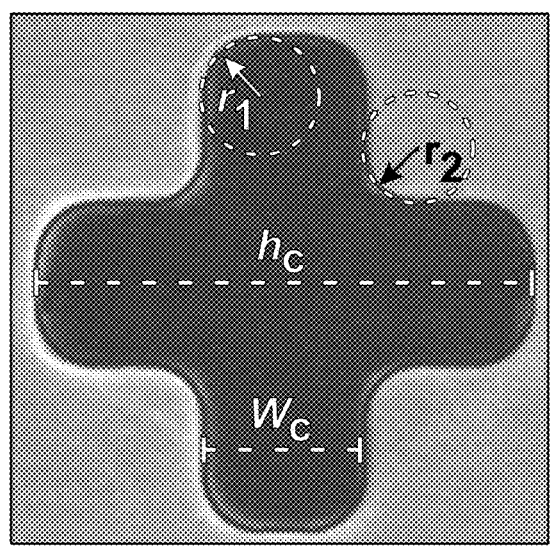

A phononic crystal 140, having a periodic unit cell in two orthogonal directions with each unit cell including an aperture in the shape of a cross therethrough as illustrated in FIGS. 4A and 4B, supports a complete band gap and therefore suppresses mechanical damping very effectively.

Figure 4C:
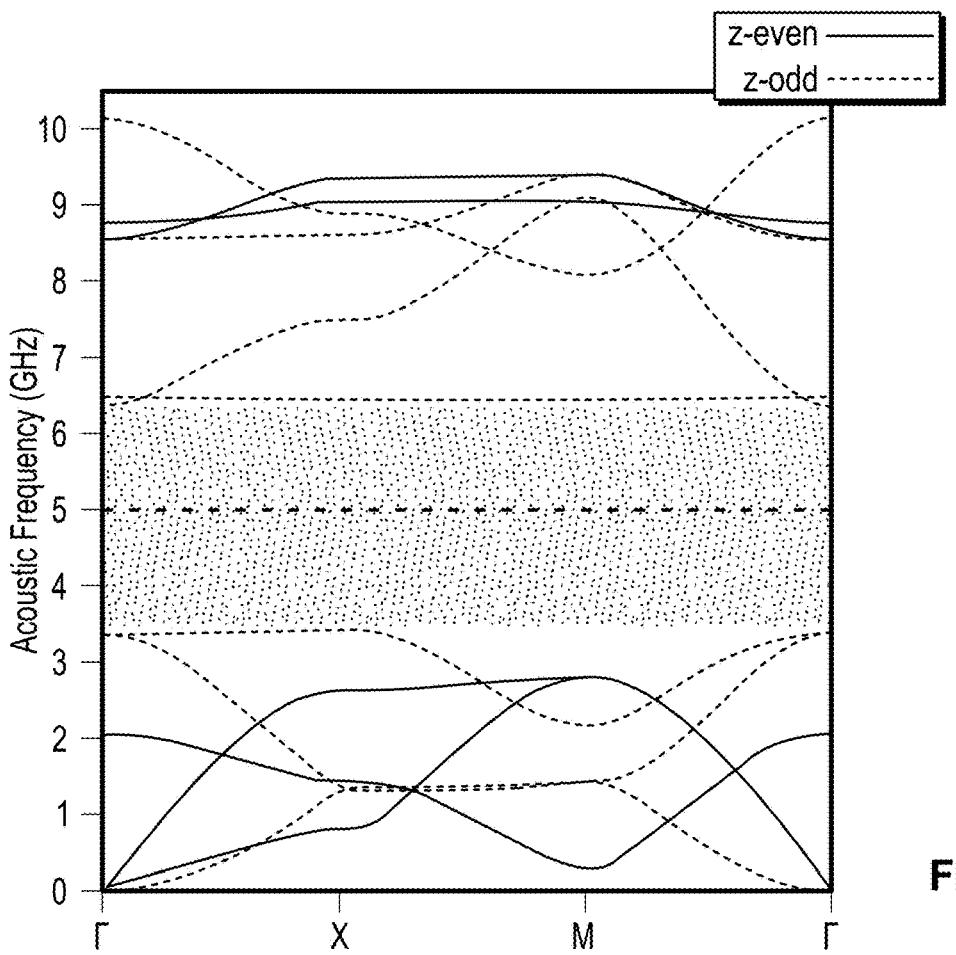
FIG. 4C illustrates the corresponding band gap size and central frequency of the phononic crystal.

See, G. S. MacCabe et al. The band gap size and central frequency, illustrated in FIG. 4C and annotated in orange and a red dashed line, respectively, are tunable depending on the geometry. Therefore, the band gap can be very large and centered around the mechanical breathing mode of the optomechanical crystal cavity 110. The strength of a phononic mirror can, for example, be maximized by simultaneously maximizing the band gap width and tuning the central frequency to coincide with the resonance of the optomechanical crystal cavity 110. Therefore, a phononic crystal 140, such as the one shown in FIGS. 4A and 4B, can be made to have a high reflectivity per unit cell. While the unit cell illustrated in FIGS. 4A and 4B has an aperture in the form of a cross, the unit cells in other embodiments of the present invention have apertures in other shapes, for example, circles, ellipses, rectangles including squares, and rounded corner rectangles or squares.

Figure 5A:
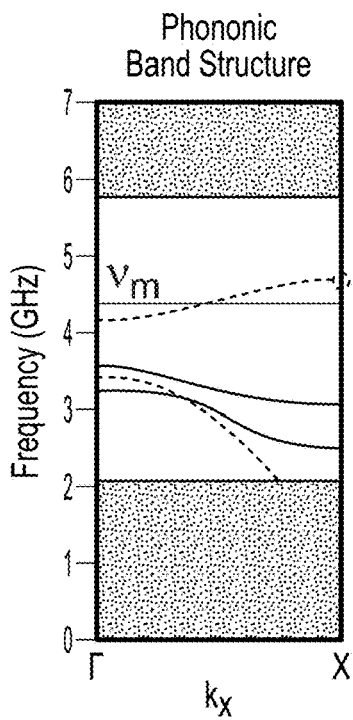
FIGS. 5A and 5B illustrate the phononic and photonic band structures for a line defect in a phononic crystal in accordance with one or more embodiments of the present invention.
Figure 5B:
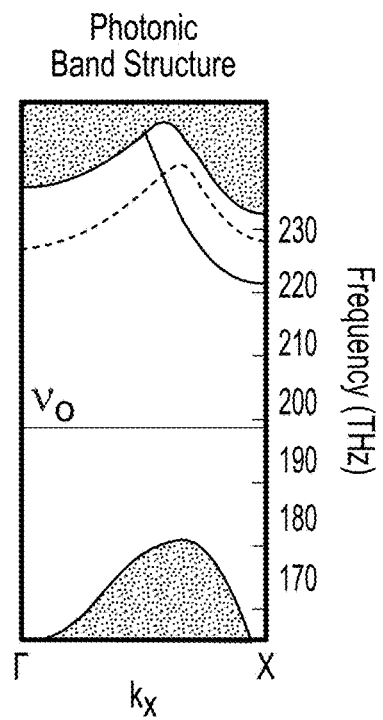

In addition to confinement, the phononic crystal 140 will also be used to couple the microwave phonon into or out of the optomechanical crystal cavity 110 with high efficiency. This is accomplished by forming a line defect in the phononic crystal 140, resulting in the phononic crystal waveguide 145. An example of the band structure for a line defect in a phononic crystal is illustrated in FIG. 5A (modified from A. H. Safavi-Naeini and O. Painter, "Proposal for an optomechanical traveling wave phonon-photon translator," New Journal of Physics, vol. 13, article no. 013017 (2011), the contents of which are incorporated herein by reference). A single band, annotated in gold, crosses the mechanical frequency of the localized cavity mode at approximately 4.5 GHz, resulting in the phononic crystal waveguide 145 that supports phonon routing between the optomechanical crystal cavity 110 and the piezoelectric transducer 130. The band gap of the phononic crystal 140 is greatly reduced by the line defect, leading to a reduced reflectivity per unit cell along the propagation direction. The photonic band structure in FIG. 5B shows that the line defect can be designed such that it is reflective for the photonic mode of the optomechanical crystal cavity 110, which avoids any optical coupling into the phononic crystal waveguide 145.

As discussed above, the coupling rate between the optomechanical crystal cavity 110 and the phononic crystal waveguide 145 can be actively tuned with an evanescently-coupled optical control field in various embodiments of the present invention. This classical optical control field will be detuned from the optical cavity resonance of the optomechanical crystal resonator 110, leading to an efficient frequency perturbation of the mechanical cavity resonance of the optomechanical crystal resonator 110 via the optical spring effect, in addition to mechanical cooling. Using this method, the spectral overlap between the mechanical cavity resonance of the localized cavity mode within the optomechanical crystal resonator 110 and the mechanical band of the phononic crystal waveguide 145 can be actively changed, which will result in a changed reflectivity of the optomechanical crystal cavity 110 for the localized cavity mode. By designing the structure such that the mechanical cavity mode is at the center of the band gap of the phononic crystal waveguide 145, the highest reflectivity can be obtained and the reflectance can be reduced by the optical control field, which will result in a mechanical mode with a frequency that is pulled away from the mid gap. By changing this reflectivity between the optomechanical crystal resonator 110 and the phononic crystal waveguide 145, one can permit or block the transfer of phonon-based information between the optomechanical crystal resonator 110 and the microwave QIS.

Figure 6A:
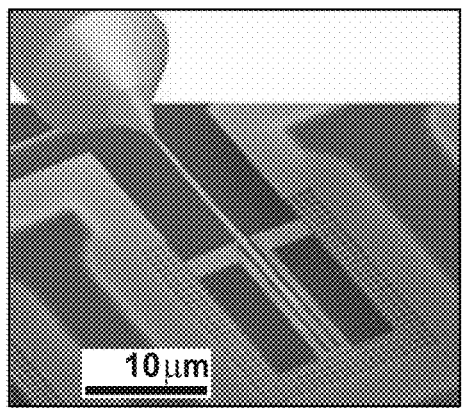
FIG. 6A illustrates an optical fiber coupled to an optomechanical device as would be employed by one or more embodiments of the present invention.
Figure 6B:
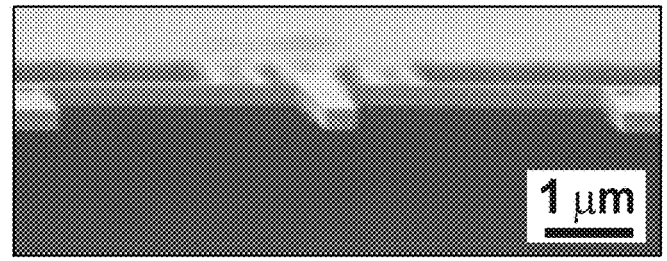
FIG. 6B is an edge view SEM of a suspended silicon inverse taper for efficient coupling to an optical fiber as would be employed by one or more embodiments of the present invention.

To populate the optomechanical crystal resonator 110 with photons to achieve the desired photon/phonon interaction, two stages of optical mode coupling are contemplated. First, light will be coupled into the on-chip optical input/output waveguide 150, which will side-couple to the optomechanical crystal resonator 110 as illustrated in FIG. 6A (adapted from S. M. Meenehan et al., "Supplementary Information for: 'Silicon optomechanical crystal resonator at millikelvin temperatures,'" Physical Review A, vol. 90, article no. 011803 (R) (2014), the contents of which are incorporated herein by reference). FIG. 6B (adapted from Meenehan) is an edge view SEM of a suspended silicon inverse taper for efficient coupling to an AR coated lensed optical fiber, such as would preferably be used for the optical input/output waveguide 150. Inverse taper edge coupling utilizes a waveguide adiabatically tapered from the desired waveguide dimensions to dimensions narrow enough that the mode becomes weakly guided, and the mode field diameter expands to that of coupling mode. The use of a lensed optical fiber, where the end of the optical fiber has been shaped to focus the output mode, narrows the mode field diameter of the coupling mode, and thus reduces the necessary waveguide inverse tapering to match that mode. At a wavelength of approximately 1550 nm, this design achieved an insertion loss of −1.9 dB when the coupling occurred inside a cryostat.

Figure 7A:
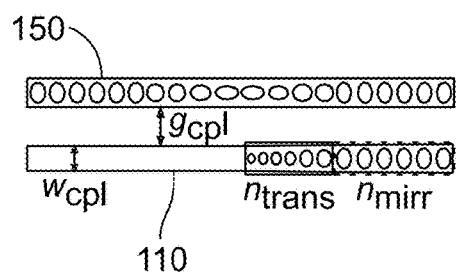
FIGS. 7A and 7B illustrate side-coupling from an optical input/output waveguide via a photonic resonator to a phononic resonator in accordance with one or more embodiments of the present invention.
Figure 7B:
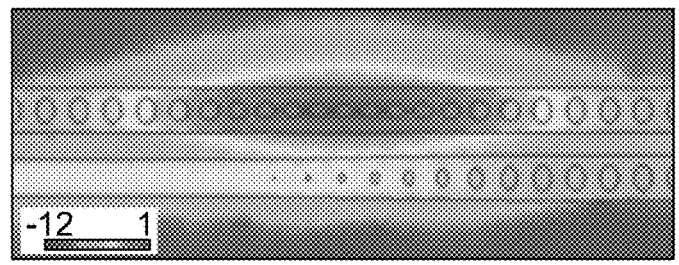
Figure 8A:
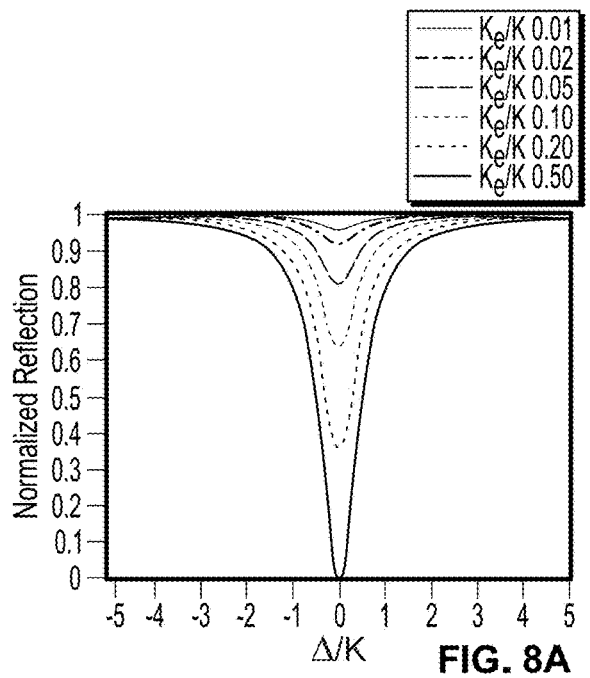
FIGS. 8A and 8B illustrate the reflection spectrum for both the under-coupled and over-coupled resonances in the case of a single side coupled photonic resonator in accordance with one or more embodiments of the present invention.
Figure 8B:
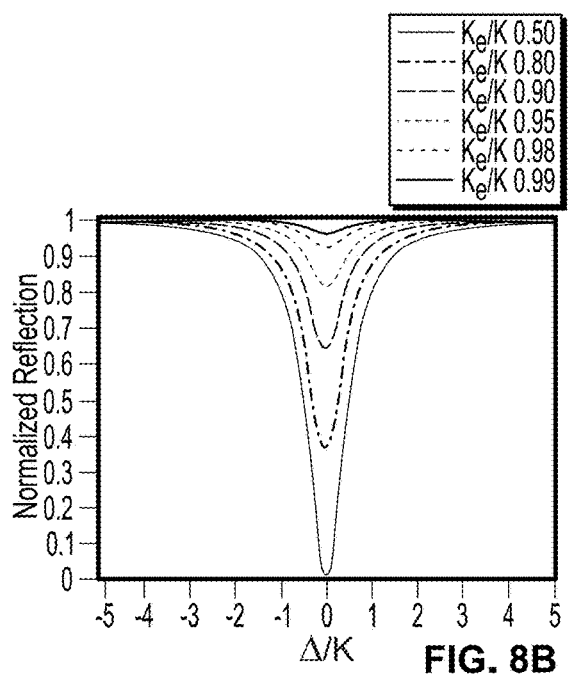

To couple from the optical input/output waveguide 150 to the optomechanical crystal cavity 110, a side-coupling design is used. Side-coupling from the optical input/output waveguide 150 (with its photonic crystal reflector 155, not illustrated in FIGS. 7A and 7B) to the optomechanical crystal resonator 110 allows for effective coupling, as illustrated in FIGS. 7A and 7B (adapted from S. M. Meenehan, "Cavity Optomechanics at Millikelvin Temperatures," Ph.D. Dissertation, California Institute of Technology (2015), the contents of which are incorporated herein by reference). Side-coupling allows for the fine tuning of the coupling between the optical input/output waveguide 150 and the optomechanical crystal resonator 110 by varying the coupling gap $g_{cpl}$. The use of a photonic crystal reflector 155 on the end of the optical input/output waveguide 150 allows for single-sided coupling to the optomechanical crystal resonator 110. Without the photonic crystal reflector 155, it would not be possible to couple all the input light into the optomechanical crystal cavity 110. This can be determined simply by considering the time reversal or a process where photons leave the optomechanical crystal cavity 110. If coupling is allowed in both directions, then photons will be equally likely to exit the optomechanical crystal cavity 110 in both directions. Thus, in-reverse, it would be necessary to pump the optomechanical crystal cavity 110 from both sides to couple all the photons in. By introducing the photonic crystal reflector 155, this complication is removed. FIGS. 8A and 8B (adapted from A. G. Krause, "Acceleration Sensing, Feedback Cooling, and Nonlinear Dynamics with Nanoscale Cavity-Optomechanical Devices," Ph.D. Dissertation, California Institute of Technology (2015), the contents of which are incorporated herein by reference) illustrate the reflection spectrum for both the under-coupled and over-coupled resonances in the case of a single side-coupled optomechanical crystal resonator 110 and optical input/output waveguide 150.

In accordance with other embodiments of the present invention, side-coupling between the optical input/output waveguide 150 and the optomechanical crystal resonator 110 is not required as the end of the optical input/output waveguide 150 is directly coupled to the end of the optomechanical crystal resonator 110. With this end-coupled configuration, no photonic crystal reflector 155 is required.

Figure 9A:
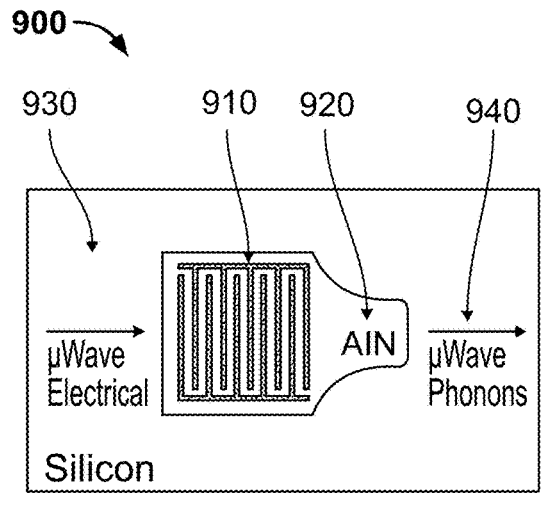
FIGS. 9A and 9B illustrate plan and cross-sectional views of a piezoelectric transducer in accordance with one or more embodiments of the present invention.
Figure 9B:
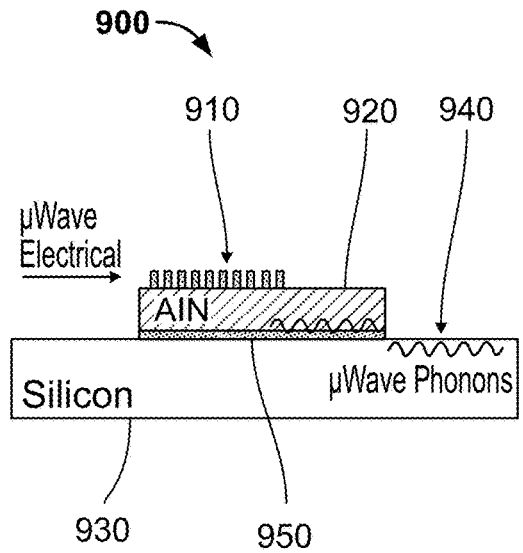

A plan view of the piezoelectric transducer 130 is illustrated in FIG. 9A, while a cross-sectional view is illustrated in FIG. 9B. Metal fingers 910 in a grating structure form an interdigitated transducer (IDT) 900, which can be used to excite acoustic waves on a piezoelectric material with an applied electrical signal. The optomechanical crystal resonator 110 requires ultra-high optical and mechanical quality factors. This can only be accomplished in silicon, which is not a piezoelectric material. Electromechanical transduction into or out of the silicon can be achieved using a thin film of a piezoelectric material, for example, an aluminum nitride-on-silicon IDT. Aluminum nitride is a piezoelectric material that has a high acoustic velocity, low acoustic loss, and excellent CMOS compatibility. See, C. M. Lin et al., "Micromachined one-port aluminum nitride Lamb wave resonators utilizing the lowest-order symmetric mode," Journal of Microelectromechanical Systems, vol. 23, pp. 78-91 (2014), the contents of which are incorporated herein by reference.

The IDT 900 with its plurality of interdigitated top electrodes 910 formed on an aluminum nitride layer 920 on a silicon membrane 930 will result in excitation of acoustic plate modes 940 referred to as Lamb waves. Lamb waves are denoted as symmetric or anti-symmetric modes depending on the particle displacement symmetry. The lowest order symmetric Lamb wave mode has a phase velocity of 10,000 m/s and an electromechanical coupling coefficient $K^2$ of 1.5-3.5% depending on the electrode configuration. See, Lin. The IDT 900 can be fabricated with or without a bottom electrode 950, but inclusion of a bottom electrode 950 will give the highest $K^2$, which is a quantitative metric for the electrical to acoustic energy conversion efficiency.

The pitch of the metal fingers 910 in the IDT 900 determines the operating frequency and the number of pairs of metal fingers 910 determines the bandwidth and insertion loss. These parameters can all be predicted and tuned with the Mason equivalent circuit model in addition to finite element method simulations. See, E. Dieulesaint and D. Royer, "Elastic Waves in Solids: Applications to Signal Processing," J. Wiley (Chichester [England], 1980), the contents of which are incorporated herein by reference. Preferably, the design of the IDT 900 produces the highest $K^2$ and operating bandwidth feasible in a given material platform.

In addition to optimizing the design of the IDT 900 for optimal operating frequency, bandwidth, impedance matching, and insertion loss, the transfer efficiency of the acoustic energy generated in the aluminum nitride layer 920 into the silicon membrane 930 is preferably maximized. Due to the larger phase velocity and density of the aluminum nitride layer 920, the specific acoustic impedance of the aluminum nitride layer 920 is six times greater than in the silicon membrane 930, resulting in efficient energy transfer. Therefore, analogous to a waveguide made with a high refractive index material and low refractive index cladding, the acoustic energy will exist primarily in the silicon membrane 930. The energy transfer will then occur with propagation of the acoustic plate modes 940. Once the energy of the acoustic plate modes 940 is in the silicon membrane 930, a phononic crystal waveguide 145 couples the IDT 900, corresponding to the piezoelectric transducer 130 illustrated in FIG. 1, to the optomechanical crystal resonator 110.

Figure 10:
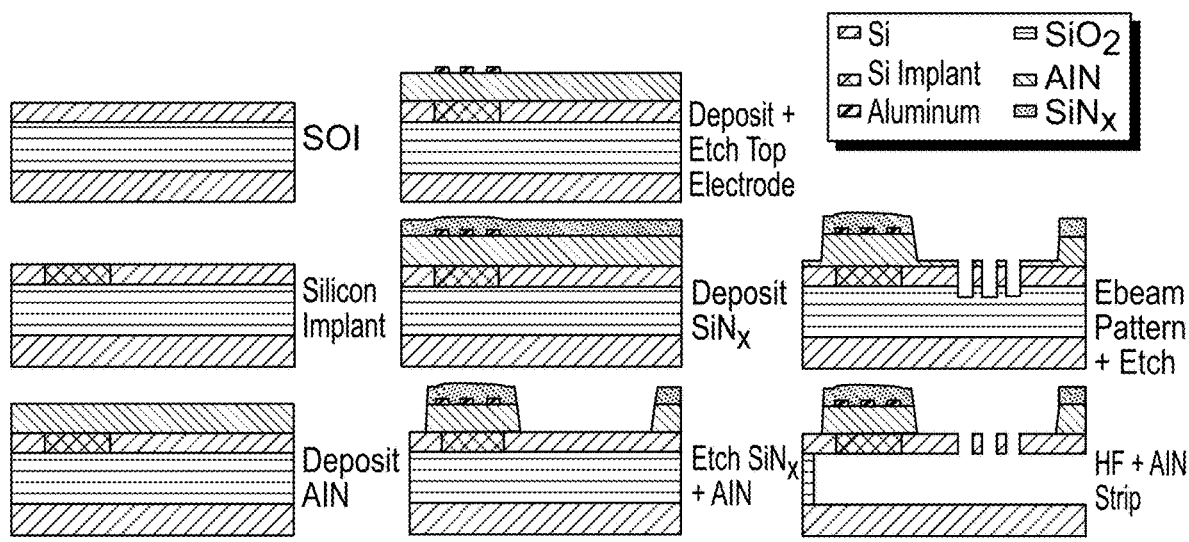
FIG. 10 illustrates the fabrication process for a quantum transducer device in accordance with one or more embodiments of the present invention.

The full quantum transducer device 100 requires fabrication of the piezoelectric transducer 130 and silicon optomechanics elements monolithically integrated together. The quantum transducer device 100 is preferably fabricated using a high-resistivity silicon-on-insulator (SOI) wafer, the overall process being illustrated in FIG. 10, with an aluminum nitride layer 920 sandwiched between metal fingers 910 and a bottom electrode 950 to form the piezoelectric transducer 130. The bottom electrode 950 may be formed by implanting the device Si layer of the SOI wafer near the dopant solubility limit, i.e., on the metallic side of the metal-to-insulator transition, such that high conductivity is maintained at millikelvin temperatures. See, T. F. Rosenbaum et al., "Metal-insulator transition in a doped semiconductor," Physical Review B, vol. 27, pp. 7509-7523 (1983), the contents of which are incorporated herein by reference. An aluminum bottom electrode 950 could alternatively be used if higher conductivity is necessary. Next, an oriented aluminum nitride layer 920 is sputter-deposited on the Si, and the metal fingers 910 are deposited and patterned using standard optical lithography and dry etching. To protect the metal fingers 910 during later aggressive wet etches, a layer of PECVD silicon nitride is preferably deposited over the top surface. To form the nearby optomechanical elements, the aluminum nitride layer 920 will be largely etched away outside of the area of the piezoelectric transducer 130. Fine patterning using electron-beam lithography and a dry etch through the Si layer will create the top surface of the phononic crystal 140. The phononic crystal 140 is released with an oxide undercut, for example, with wet or vapor phase HF processing. Lastly, wet processes may be used to clean the exposed Si surfaces of the quantum transducer device 100: strip any remaining aluminum nitride, remove organic residues, and passivate the reactive Si surface to achieve the desired high quality factors for the optomechanical crystal resonator 110.

Various embodiments of the present invention may be fabricated using alternative materials to those described above. For example, the aluminum nitride layer 920 of the IDT 900, i.e., the piezoelectric transducer 130, may be formed of other piezoelectric materials. One leading candidate is $LiNbO_3$ (lithium niobate). One significant advantage to lithium niobate is that it may be used to replace the silicon-on-insulator (SOI) wafer completely. This more monolithic approach should provide improved performance but would do so at the cost of greater fabrication complexity. Other potential piezoelectric materials include Pb [$Zr_xTi_{1-x}$]$O_3$ (0≤x≤1) (lead zirconium titanate or PZT), $LiTaO_3$ (lithium tantalite), [$Al_xSc_{1-x}$]N (0≤x≤1) (aluminum scandium nitride), various ceramics, and various III-V and II-VI semiconductors.

Alternative substrates include SiN (silicon nitride) and diamond. The layer used to form the phononic crystal 140 is preferably optically transparent and has a very high mechanical quality factor Q at the very low operating temperature of the quantum transducer device 100.

While the above-described embodiments of the present invention operated with photons in the telecommunications window centered around 1550 nm, operation at other wavelengths is possible. For example, operation in the visible or near infrared (NIR) may be preferred depending upon the specific application.

Figure 11A:
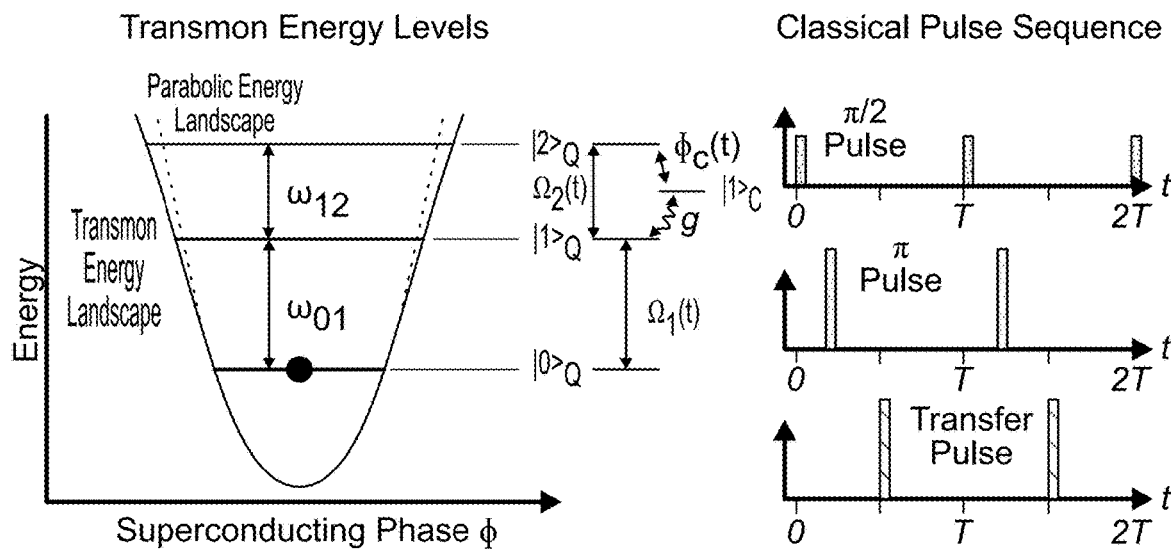
FIGS. 11A-11B illustrate a one-dimensional (1D) phonon cluster state generator in accordance with one or more embodiments of the present invention.
Figure 11B:
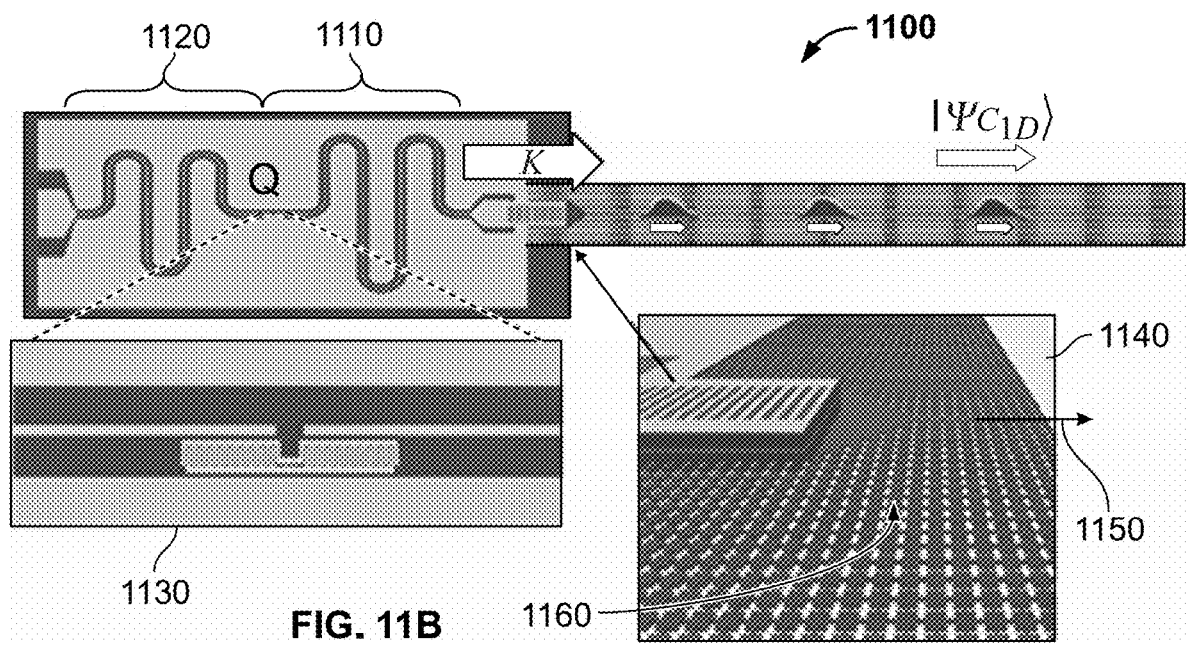

An exemplary one-dimensional (1D) phonon cluster state generator 1100 in accordance with one or more embodiments of the present invention is illustrated in FIGS. 11A-11B. The 1D phonon cluster state generator 1100 employs an approach that produces 1D cluster states from a three-level atomic system in an optical cavity with a single output channel. See, N. H. Lindner and T. Rudolph, "Proposal for Pulsed On-Demand Sources of Photonic Cluster State Strings," Physical Review Letters, vol. 103, art. no. 113602 (2009), the contents of which are incorporated herein by reference. FIG. 11A (left) shows a schematic energy level diagram of an anharmonic superconducting circuit transmon qubit. The first three transmon energy levels (labeled with Q for "qubit"), $|0\rangle_Q$, $|1\rangle_Q$, and $|2\rangle_Q$, result in two unequal transition frequencies, $\omega_{01}$ and $\omega_{12}$. The three-level atomic system's amplitudes in these states can be manipulated by applying classical microwave pulses. The 1D phonon cluster state generator 1100 includes two microwave cavities 1110, 1120 that interact with the transmon through a Jaynes-Cummings type Hamiltonian. See, T. Niemczyk et al., "Circuit quantum electrodynamics in the ultrastrong-coupling regime," Nature Physics, vol. 6, no. 10, pp. 772-776 (2010), the contents of which are incorporated herein by reference. The output cavity 1110 is exactly resonant with the transition from the first excited state to the second excited state, $\omega_{12}$ (and so is off-resonance with $\omega_{01}$). The readout cavity 1120 is detuned from both $\omega_{12}$ and $\omega_{01}$ and does not play a significant role in the generation of phonons, though it does play a large role in the detection of phonons. Three classical control fields allow driving transitions between the system states. The transition $|0\rangle_Q \rightarrow |1\rangle_Q$ can be driven with an externally applied classical microwave field, providing a time-dependent (tunable) coupling rate $\Omega_1(t)$. The transition $|1\rangle_Q \rightarrow |2\rangle_Q$ is likewise driven with an externally applied classical microwave drive that produces coupling rate $\Omega_2(t)$. The third classical control field $\Phi_e(t)$ allows rapid detuning of the transmon transition frequencies by a flux that is injected into the transmon via a wire with a time-dependent (tunable) current. $\Phi_e(t)$ can be used to convert excitations of the transmon into microwave photons in the output cavity 1110. The center portion of FIG. 11A is an energy level diagram illustrating classical control fields and circuit QED interactions that couple the various transmon and output cavity fields. The corresponding sequence of classical control field pulses required to generate the 1D cluster state is illustrated in the right portion of FIG. 11A.

FIG. 11B illustrates a schematic of the 1D phonon cluster state generator 1100 that produces the 1D phonon cluster state. The transmon 1130 is constructed of superconducting metal on top of an insulator formed into various circuit elements, including capacitors, transmission lines, microwave cavities (resonators), and a pair of Josephson Junctions formed by including a separate superconducting metal layer separated by a nanometer-scale tunnel junction. The output cavity 1110 is formed by two capacitors that form mirrors on either end of a transmission line, with the electric field of the output cavity 1110 coupled to the transmon 1130. One of the capacitors of the output cavity 1110 is also a piezoelectric transducer 1140 that produces phonons at a rate, $\kappa$, in response to a voltage on its interdigital electrodes that comes from fields stored in the output cavity 1110. This allows the piezoelectric transducer 1140 to perform quantum transduction between microwave photons in the output cavity 1110 and microwave phonons at the same frequency. The piezoelectric transducer 1140 generally corresponds to the piezoelectric transducer 130 described above, though the number and size of the electrodes will differ to better match the impedance of the output cavity 1110.

The piezoelectric transducer 1140 is coupled to a phononic waveguide 1150, illustrated in FIG. 11B, and in greater detail in FIGS. 12A-12D. In an exemplary embodiment of the present invention, the phonons propagate in phononic crystals formed in single-crystal silicon suspended membranes. This is because the phonons have propagation times exceeding seconds and propagation lengths exceeding kilometers at dilution refrigerator temperatures, where the transmon 1130 must operate. This ultimately ensures that phonon decoherence does not limit the generation of cluster states, as it has with photons. The waveguide 1150 will be formed in a phononic crystal 1160 that allows precise tailoring of the phonon dispersion and spatial modes. Another key feature of phononic crystal waveguides is that they can be used to precisely tailor the phonon dispersion; i.e., the frequency dependence of the phononic phase and group velocity can be controlled completely by the geometry of the phononic crystal waveguide 1150.

Figure 12A:
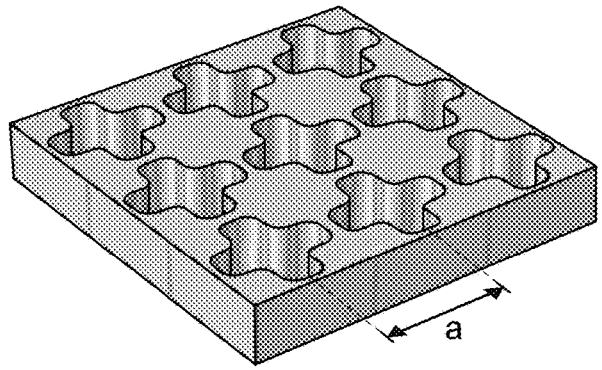
FIGS. 12A-12D illustrate a piezoelectric transducer coupled to a phononic waveguide in accordance with one or more embodiments of the present invention.
Figure 12B:
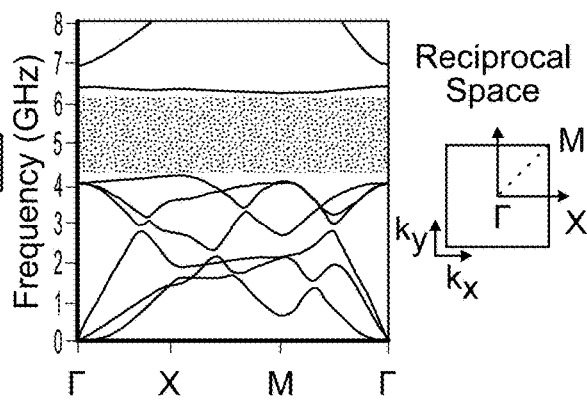
Figure 12C:
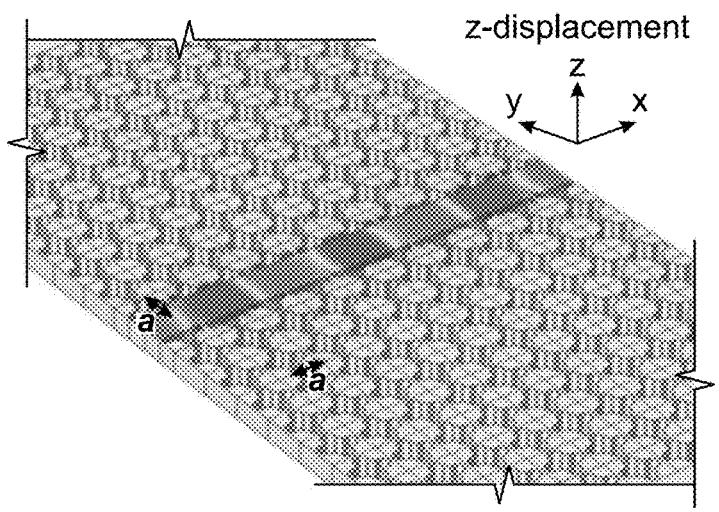
Figure 12D:
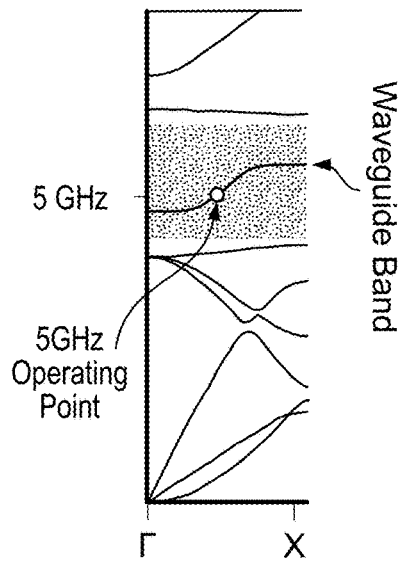

FIG. 12A illustrates the two-dimensional (2D) phononic lattice geometry of the phononic crystal 1160. FIG. 12B illustrates the phononic band structure of the phononic crystal 1160 calculated using a finite element method, showing a large bandgap (annotated in red) centered at the operating frequency of the transmon 1130. FIG. 12C illustrates in detail the phononic crystal waveguide 1150, specifically, that the phononic crystal waveguide 1150 is a phononic crystal defect waveguide formed by removing a row of holes. FIG. 12D is a portion of FIG. 12B and illustrates the normal dispersion at the operating frequency of the transmon 1130.

The protocol for 1D cluster state production, illustrated in the right portion of FIG. 11A, begins with the application of a pulse of $\Omega_1(t)$ (at frequency $\Omega_{01}$) that produces equal superposition between $|0\rangle_Q$ and $|1\rangle_Q$, resulting in the transmon state $|0\rangle_Q + |1\rangle_Q$ (ignoring normalization). This is known as a "$\pi/2$ pulse." Next, a pulse of $\Omega_2(t)$ (at frequency $\Omega_{12}$) produces coupling between $|1\rangle_Q$ and $|2\rangle_Q$ that results in all the amplitude in $|1\rangle_Q$ being transferred to $|2\rangle_Q$, resulting in the state $|0\rangle_Q + |2\rangle_Q$. This is known as a "$\pi$ pulse." Next, $\Phi_e(t)$ is applied to rapidly tune the system into resonance with the output cavity 1110. Due to the strong coupling between the output cavity 1110 and the transmon 1130 now tuned into resonance, the photon state of the output cavity 1110 is included in the system state. Because the system state does not contain any photons, the state is $|0\rangle_Q |0\rangle_1 + |2\rangle_Q |0\rangle_1$, where the subscript "1" represents the state of the phonon produced by the first pulse sequence. Left in the current state, strong coupling between the output cavity 1110 and the current state of the transmon 1130 causes a transition from $|2\rangle_Q |0\rangle_1 \rightarrow |1\rangle_Q |1\rangle_1$ at a rate g, producing a photon and leaving the system in the Bell state, $|0\rangle_Q |0\rangle_1 + |1\rangle_Q |1\rangle_1$. Thus, the microwave photon in the output cavity 1110 is now maximally entangled with the transmon state. The flux is then removed, detuning the transmon 1130 and ceasing the coupling between the output cavity 1110 and the transmon 1130. The photon then couples out of the output cavity 1110 via the piezoelectric transducer 1140 at rate K, which is determined by the relative impedances of the output cavity 1110 and the piezoelectric transducer 1140.

As long as the piezoelectric transducer 1140 is lossless and the output coupling rate is larger than the decoherence time of the output cavity 1110, this produces a single phonon on its output, albeit with a different temporal envelope. Thus, the system state is now equal to the Bell state $|0\rangle_Q |0\rangle_1 + |1\rangle_Q |1\rangle_1$, where the subscript "1" represents the state of the phonon produced by the first pulse sequence. It should be noted that the Bell state is the (trivial) two-qubit, one-dimensional cluster state. The Hilbert space considered for the generation of cluster states is the set of states that describe whether there is a phonon in the kth time slot, $|1\rangle_k$, or there is not a phonon in the kth time slot, $|0\rangle_k$. It can be shown that repeating the above pulse sequence illustrated in the right portion of FIG. 11A at a time T after the application of the first pulse leads to the state $|0\rangle_Q |0\rangle_1 |0\rangle_2 + |0\rangle_Q |0\rangle_1 |1\rangle_2 + |0\rangle_Q |1\rangle_1 |0\rangle_2 - |0\rangle_Q |1\rangle_1 |1\rangle_2 + |1\rangle_Q |0\rangle_1 |0\rangle_2 + |1\rangle_Q |0\rangle_1 |1\rangle_2 - |1\rangle_Q |1\rangle_1 |0\rangle_2 + |1\rangle_Q |1\rangle_1 |1\rangle_2$, which is exactly the three qubit, one-dimensional cluster state. Repeating the sequence N times produces the N-qubit, one-dimensional cluster state, the desired result. The cluster then consists of the transmon entangled with a train of mutually entangled phonons with temporal spacing T and spatial spacing vT, where v is the velocity of sound in the phononic crystal waveguide 1150. This train of mutually entangled phonons is illustrated in FIG. 11B.

One challenge in producing cluster states will be efficient quantum piezoelectric transduction of microwave electric fields to phonons with high quantum fidelity. The piezoelectric effect is most generally described by a set of coupled equations that relate stress and induced charge, with a tensor that describes the material's coupling between all possible stress tensor components and all possible internal dipole fields created by the induced charge. This material tensor dictates the conversion efficiency from electrical energy to mechanical energy, which is quantified by an electromechanical coupling coefficient ($K^2$) for a given orientation of the electric fields and resulting stress tensor components. It can be shown that the electromechanical coupling coefficient, the piezoelectric material's dielectric tensor, and the geometry of the piezoelectric transducer 1140 and its electrodes completely determine the electrical impedance characteristics of the piezoelectric transducer 1140.

This electrical impedance governs the interaction of the piezoelectric transducer 1140 with the superconducting circuit and qubit. Thus, the quantum transduction efficiency ultimately depends on $K^2$ and the geometry of the piezoelectric transducer 1140, especially the number of electrodes, N. Therefore, to first order, a unidirectional piezoelectric transducer 1140 that has a large N or is on a material with a large intrinsic $K^2$ will add no additional loss to the 1D phonon cluster state generator 1100. However, second order effects, such as internal reflections, will lead to significant losses for large N, and therefore it is advantageous to focus on the piezoelectric material properties and system geometry to maximize $K^2$. This advantage is further amplified by a fundamental tradeoff in piezoelectric transducers, which is that increasing N increases the piezoelectric transducer's efficiency of transduction, but it also decreases the piezoelectric transducer's bandwidth. Ultimately, phonons must be generated with some finite bandwidth sufficient to realize the phononic cluster state generation protocols described above.

Figure 13A:
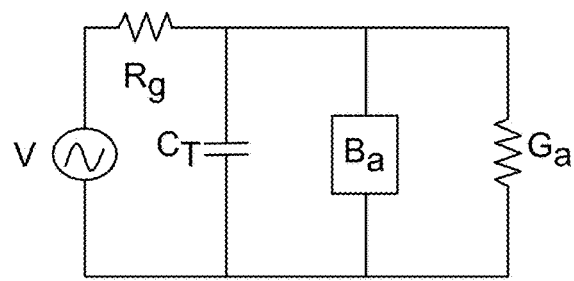
FIGS. 13A-13C illustrate a model of a piezoelectric transducer in accordance with one or more embodiments of the present invention.
Figure 13B:
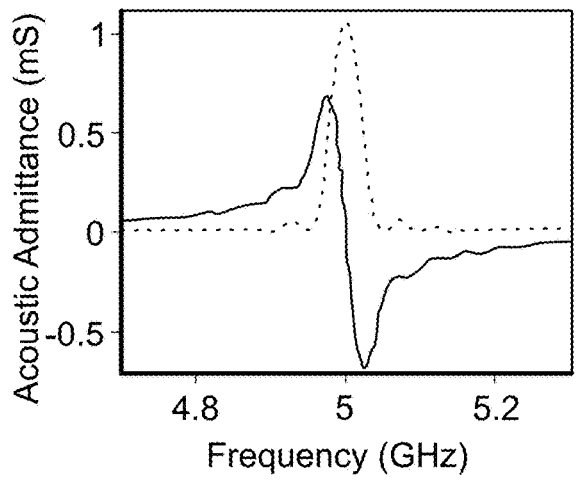
Figure 13C:
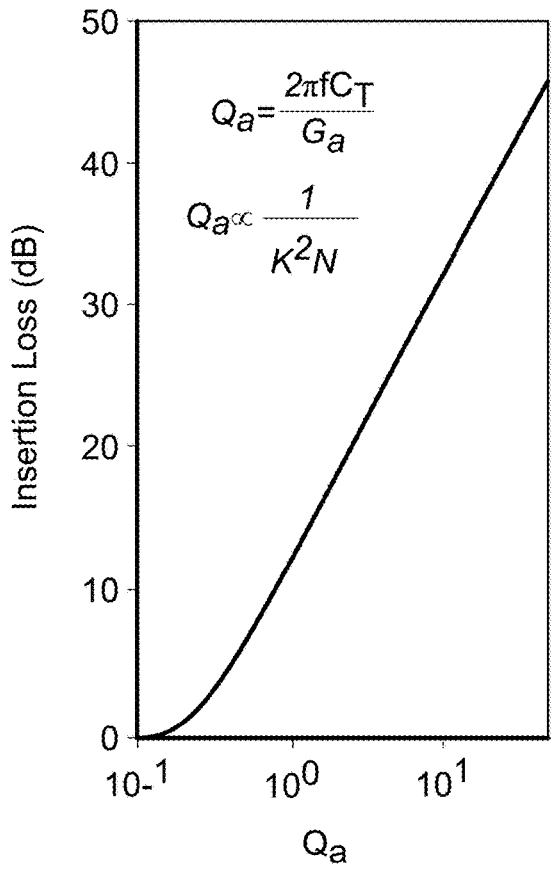

To efficiently produce phonons via transduction, one must precisely control the electrical and acoustic impedance of the piezoelectric transducer 1140, as this determines the coupling rates between input microwave fields and output phonon fields. The electrical impedance of an interdigital piezoelectric transducer 1140 can be described by an equivalent circuit model as illustrated in FIG. 13A. The impedance has two primary components. The first component, which is purely imaginary in the circuit model, is due to the capacitance of the piezoelectric transducer 1140 created by straddling the dielectric (piezoelectric) material with metal electrodes, and this is present even if the material under the electrodes is not piezoelectric. The second component is due to the piezoelectric interaction, as illustrated in FIG. 13B, in which the radiation conductance (blue) and radiation susceptance (orange) are shown as a function of frequency. The acoustic radiation leads to a real contribution to the impedance that can be modeled as a resistor in the equivalent electrical circuit—this is called the radiation conductance. In the equivalent circuit, the acoustic potential energy of the piezoelectric transducer 1140 can be represented as a capacitance, and its kinetic energy can be represented as an inductance. Similar to an electrical inductor-capacitor resonator, there exists a single frequency—the resonance frequency—at which the acoustic capacitance is canceled by the acoustic inductance, leaving only the acoustic radiation conductance and the transducer capacitance in the total impedance. The ratio between the remaining transducer capacitance and radiation conductance is quantified by an acoustic quality parameter $Q_a$, and it is fundamentally this property of the piezoelectric transducer 1140 that determines its transduction efficiency on resonance. In FIG. 13C, the insertion loss of the piezoelectric transducer 1140, which represents the infidelity of quantum transduction from photons to phonons, is plotted as a function of $Q_a$.

The capacitance of the piezoelectric transducer 1140 is proportional to N, while the radiation conductance is proportional to $K^2$ and $N^2$. The problem of minimizing quantum transduction infidelity thus reduces to a problem that can be solved for a given material and geometry. However, introducing the bandwidth constraint means the problem does not necessarily have a solution. Thus, a trade-off of materials and geometries may be made to minimize the quantum infidelity while maintaining sufficient transduction bandwidth.

Figure 14A:
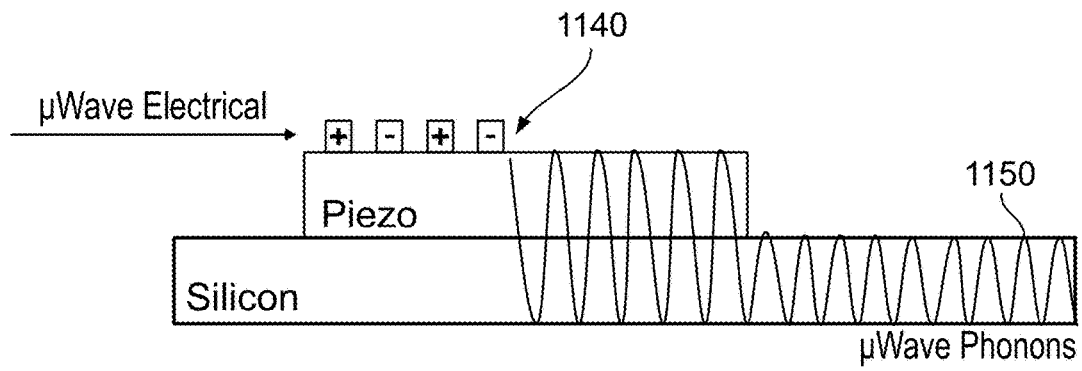
FIGS. 14A and 14B illustrate loss mechanisms of a piezoelectric transducer in accordance with one or more embodiments of the present invention.
Figure 14B:
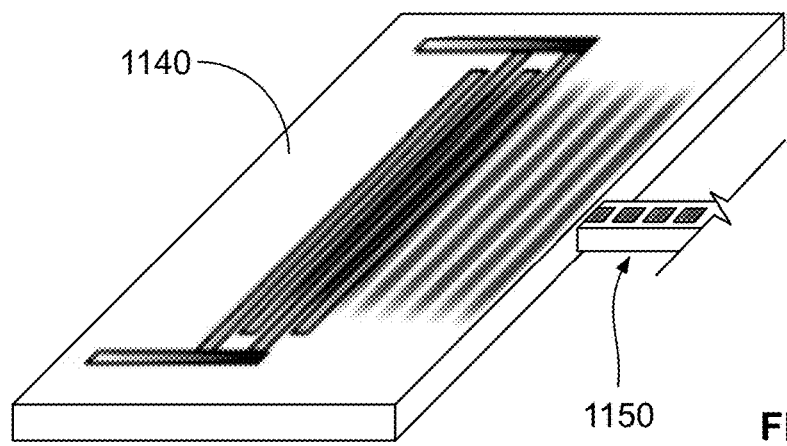

After phonons are generated by the piezoelectric transducer 1140, they must be coupled into the single-mode, silicon-based phononic crystal waveguide 1150. To realize the extremely low phononic decoherence rates of the phononic crystal waveguide 1150, the phononic crystal waveguide 1150 must not be in contact with any of the piezoelectric material used to form the piezoelectric transducer 1140. The requirement of removing the piezoelectric material and focusing the phonons' energy into the phononic crystal waveguide 1150 presents two extra sources of loss for the phonons. The first source of loss occurs when the phonons go from the region where there is piezoelectric material over the silicon into the region where there is no piezoelectric material. Specifically, the mismatch in acoustic impedance results in reflection, and thus quantum transduction infidelity for outgoing phonons. This is illustrated in FIG. 14A. The second source of loss, illustrated in FIG. 14B, occurs because maintaining sufficient bandwidth for the transduction process requires using a small number of wide electrodes (rather than a large number of narrow electrodes) for the IDT of the piezoelectric transducer 1140. This results in a piezoelectric transducer 1140 that is much wider than the phononic crystal waveguide 1150, which must be on the order of half a wavelength wide to ensure that only one waveguide mode can exist at the operating frequency. This, in turn, means that phonons cannot efficiently couple into the phononic crystal waveguide 1150 because their energy is distributed in a width much larger than the phononic crystal waveguide 1150. One solution to this problem is focusing the acoustic energy into the phononic crystal waveguide 1150. Potential mechanisms include modifications to the design of the piezoelectric transducer 1140 that allow it to produce a diffraction-limited acoustic beam of phonons, as well as acoustic "horns" that slowly guide the phonons from the larger width to a smaller width. See A. Siddiqui et al., "Lamb Wave Focusing Transducer for Efficient Coupling to Wavelength-Scale Structures in Thin Piezoelectric Films," Journal of Microelectromechanical Systems, vol. 27, no. 6, pp. 1054-1070 (2018) and Y. D. Dahmani et al., "Piezoelectric transduction of a wavelength-scale mechanical waveguide," Physical Review Applied, vol. 13, art. no. 024069 (2020), the contents of each of which are incorporated herein by reference.

Once 1D phonon cluster states have been created, a reliable method for detecting single phonons is required. The states of a transmon qubit can be detected extremely efficiently via quantum non-demolition measurements that use the reflection of microwave signals from a cavity coupled to the transmon to detect the state. See B. Johnson et al., "Quantum non-demolition detection of single microwave photons in a circuit," Nature Physics, vol. 6, no. 9, pp. 663-667 (2010), the contents of which are incorporated herein by reference. In addition, a low-noise, integrated Josephson parametric amplifier may be used to boost the readout fields many orders of magnitude without adding significant quantum noise. See W. F. Kindel et al., "Generation and efficient measurement of single photons from fixed-frequency superconducting qubits," Physical Review A, vol. 93, art. no. 033817 (2016), the contents of which are incorporated herein by reference. The main challenge in phonon detection is to go from a propagating single phonon to the excitation of the transmon with high fidelity.

High fidelity conversion from a single propagating microwave photon to a qubit excitation has been demonstrated by employing mechanisms to time-reverse the envelope of the wave function of the photon. See J. Wenner et al., "Catching Time-Reversed Microwave Coherent State Photons with 99.4% Absorption Efficiency," Physical Review Letters, vol. 112, art. no. 210501 (2014), the contents of which are incorporated herein by reference. This is because a time-reversed wave function propagating toward a microwave cavity cannot be distinguished from an emitted photon's wave function propagating away from the cavity. Thus, the microwave photon will be absorbed by the cavity with the same efficiency with which it was emitted. This same technique is used here with respect to microwave phonons.

To accomplish the time-reversal of the phononic wave function envelope, the tailorable dispersion of phononic crystal waveguides is used. By using a microwave photonic system (no phonons created) with a transmon cavity output mirror and microwave transmission line with the same electrical impedance properties as the quantum piezoelectric transducer, one can detect the pulse profile. Once the temporal profile is approximately determined, analytical techniques are used to determine what the dispersion of a pulse shaping phononic crystal waveguide would need to be to reshape the temporal characteristics of the pulse envelope into a time-reversed version of itself. A phononic crystal waveguide geometry can then be found that has the exact dispersion required to perform the necessary temporal transformation. The phononic crystal waveguide can then be physically made with electron beam lithography and plasma etching of silicon.

Figure 15:
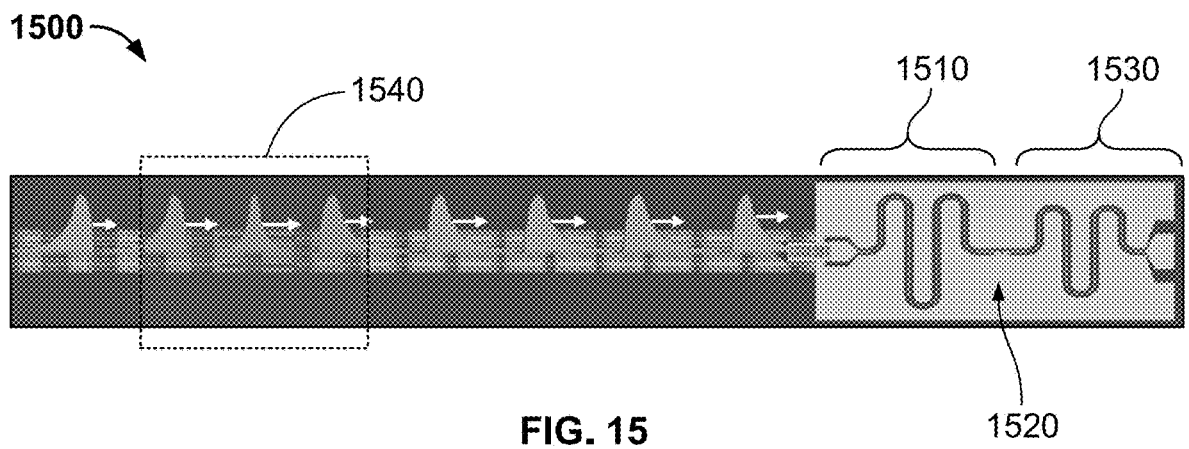
FIG. 15 illustrates a phonon detector system in accordance with one or more embodiments of the present invention.

Once the phonon wave functions have been time-reversed, they will be nearly perfectly absorbed by an input cavity 1510 of a phonon detector device 1500, i.e., a receiving phononic device, as illustrated in FIG. 15. The 1D phonon cluster state generator 1100 has been mirrored to act as the time-reversed phonon detector device 1500. The absorption of the phonon produces a single photon in the input cavity 1510 of the phonon detector device 1500, which has the time-reversed temporal envelope of the microwave photons generated by the phonon source system, for example, the 1D phonon cluster state generator 1100. Since the arrival time of all phonon pulses and their conversion to photons in the input cavity 1510 can be determined, a classical control sequence using injected magnetic flux can then be precisely and synchronously applied to the phonon detector device 1500. The flux's time profile is also a time-reversed version of the flux that was originally used to generate the phonons. This transfers the excitation back to the transmon 1520 of the phonon detector device 1500. Once the excitation is in the transmon 1520, the highly dispersive coupling between the (far off resonance) transmon output cavity 1530 and the transmon 1520 allows the state to be determined with high fidelity by measuring the phase of signals reflected from the transmon output cavity 1530, essentially implementing a quantum non-demolition measurement of the transmon's energy. See Kindel and Wenner. FIG. 15 also illustrates the pulse shaping phononic crystal waveguide 1540 that feeds the phonons into the input cavity 1510.

While the above-described embodiments of the present invention dealt with generating transmons and phonons, they did not address the ultimate goal of creating multi-particle entanglement and phononic cluster states with dimensionality higher than 1, which requires controlling the phase and amplitude of phonons as they propagate through phononic crystal waveguides and circuits. Further, by controlling the phase velocity of the phonons, one may also control where the phonons are directed as well as when.

Figure 16A:
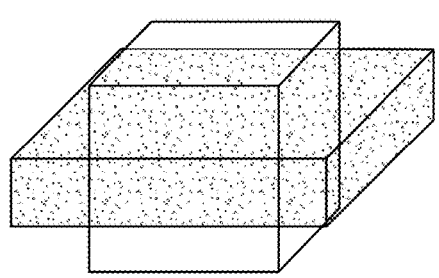
FIGS. 16A and 16B illustrate two different ways in which phonon phase velocity may be altered by stress in accordance with one or more embodiments of the present invention.
Figure 16B:
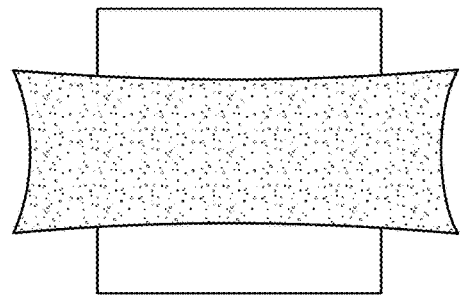

Since the angular (temporal) frequency ω is conserved, the phonon phase velocity $v_p=\omega/k$ can be altered by modulating the spatial frequency k. Two physical mechanisms for inducing a shift Δk are illustrated in FIGS. 16A-16B. The first arises from hyperelasticity, as illustrated in FIG. 16A, which occurs because single-crystal silicon is brittle and undergoes minimal plastic deformation. Rather, at high strain the conventional approximation to the elastic strain energy, in which the series is terminated at second order, must be extended to the third order term. The second way in which phonon phase velocity may be altered by stress comes from the moving boundary effect, as illustrated in FIG. 16B, which causes a deformation of the cross-section of the waveguide, thereby modifying the wavevector.

In response to an applied stress, the band of the guided mode is shifted by an amount Δω, which in general varies across the Brillouin zone. Hyperelasticity and the moving boundary effect sum together to yield the function Aw and are leveraged against the dispersion, or group velocity $v_g=d\omega/dk$, of the band to yield the phase shift. For small perturbations Δω, it follows that $\Delta k=\Delta\omega/v_g$. Since dispersion is a property of the geometry of the waveguide, designing a waveguide with the desired dispersion is critical to obtaining a useful device. In practice, it is possible to identify structural parameters to tune bands of various dispersion characteristics into the band gap, for example, to yield extremely low dispersion and to ensure that there is a non-degenerate band minimum or maximum at the center or edge of the Brillouin zone. These operating points are then particularly effective for creating reconfigurable mirrors and phase shifters. The membrane can only be placed into tension effectively, and in a state of tension Δω>0 in the systems of interest. Thus, operating at a band minimum moves the operating frequency off the guided band even though it remains in the band gap of the surrounding phononic crystal cladding, so the operating frequency will be reflected. Conversely, operating at the band edge where the dispersion is especially low yields a strong alteration of the spatial frequency, and a correspondingly large phase shift.

Figure 17:
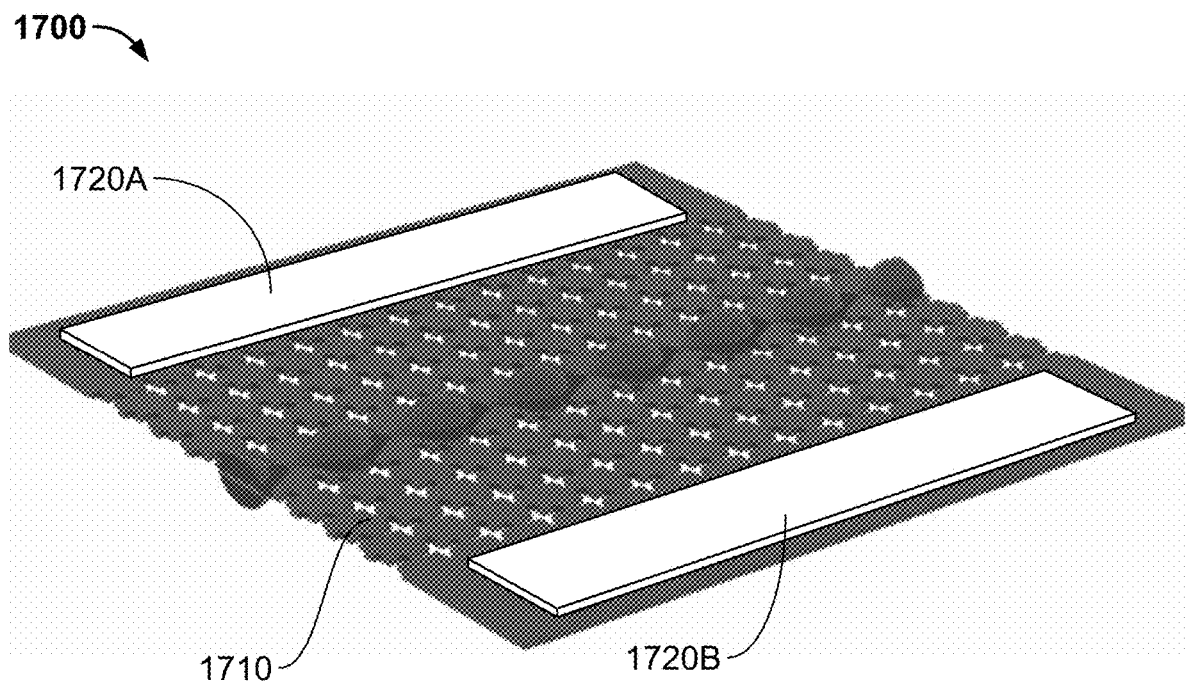
FIG. 17 illustrates a strain-based phase shifter in accordance with one or more embodiments of the present invention.

A first device employing stress to control the phase of a phonon is a strain-based phase shifter 1700, as illustrated in FIG. 17. The strain-based phase shifter 1700 includes a phononic crystal waveguide 1710 and a pair of strain actuators 1720A, 1720B. A phonon travels along the phononic crystal waveguide 1710, while the pair of strain actuators 1720A, 1720B apply the desired stress, thereby inducing the desired shift in the phase of the phonon.

Figure 18A:
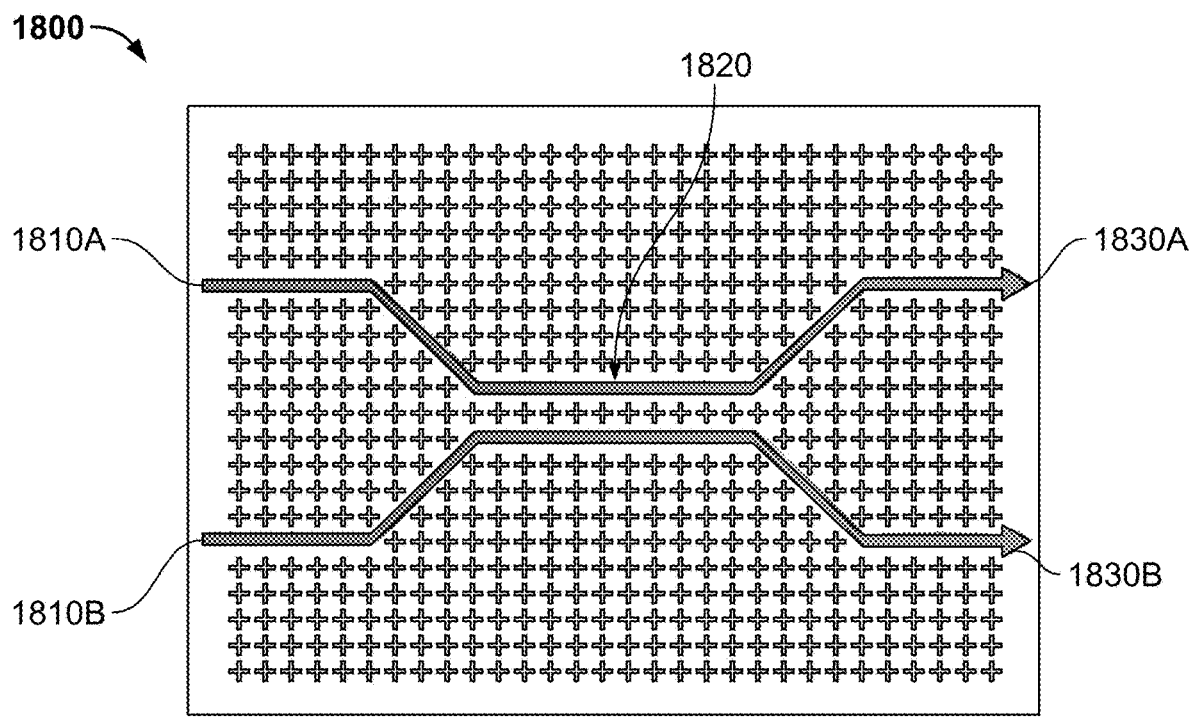
FIGS. 18A and 18B illustrate a phononic crystal circuit and a reconfigurable Mach-Zehnder phonon interferometer, respectively, in accordance with one or more embodiments of the present invention.
Figure 18B:
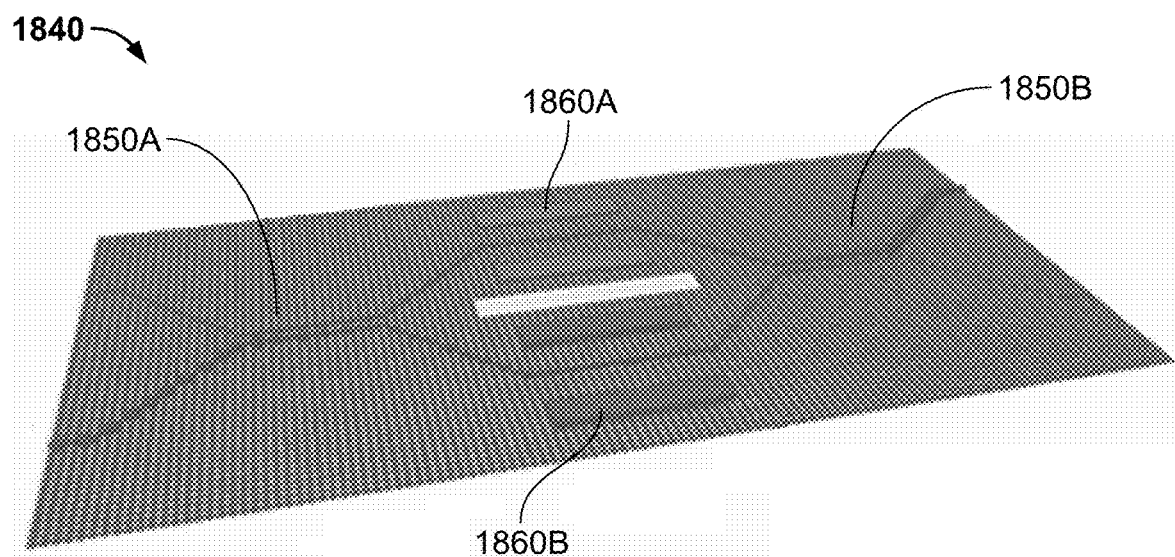

With a phase shifter, for example, the strain-based phase shifter 1700 illustrated in FIG. 17, one can create a reconfigurable Mach-Zehnder phonon interferometer (MZPI). The reconfigurable MZPI will allow cluster states generated in neighboring waveguide channels to be entangled by using the reconfigurable MZPI as a beam-splitter with reconfigurable amplitude splitting between the two output channels. FIG. 18A illustrates a phononic crystal circuit 1800 that implements a fixed 50:50 beam-splitter function between two adjacent input waveguide channels 1810A, 1810B by coupling them together for a fixed length at coupling region 1820. The amplitude of the splitting of the two output waveguide channels 1830A, 1830B can be controlled by modifying the local geometry of the phononic crystal lattice in the coupling region 1820. In like manner, a beam-combiner function can be implemented in which the coupling region is design to couple both input phononic signals to a single output waveguide channel. Phononic crystal circuits implementing beam-splitter or beam-combiner functions will be termed couplers. FIG. 18B illustrates how two fixed 50:50 couplers 1850A, 1850B, for example, the phononic crystal circuit 1800 illustrated in FIG. 18A (one acting as a splitter, the other as a combiner), and two phase shifters 1860A, 1860B, for example, the strain-based phase shifter 1700 illustrated in FIG. 17, can be combined to create a reconfigurable MZPI 1840. The amplitude splitting ratio of the reconfigurable MZPI 1840 can be controlled by differentially straining the two phase shifters 1860A, 1860B in the two arms of the reconfigurable MZPI 1840. In the reconfigurable MZPI 1840 illustrated in FIG. 18B, red and blue represent equal and opposite strains in the two phase shifters 1860A, 1860B.

Figure 19A:
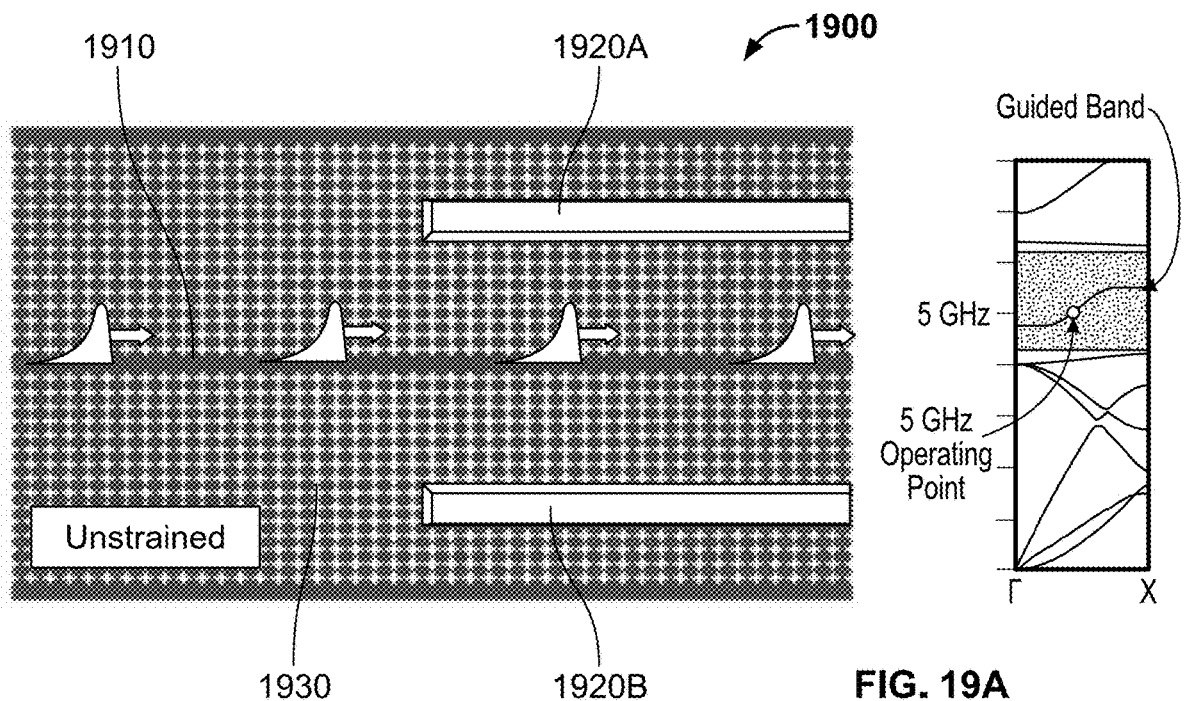
FIGS. 19A and 19B illustrate a reconfigurable reflectivity mirror in the transmit and reflect states, respectively, in accordance with one or more embodiments of the present invention.
Figure 19B:
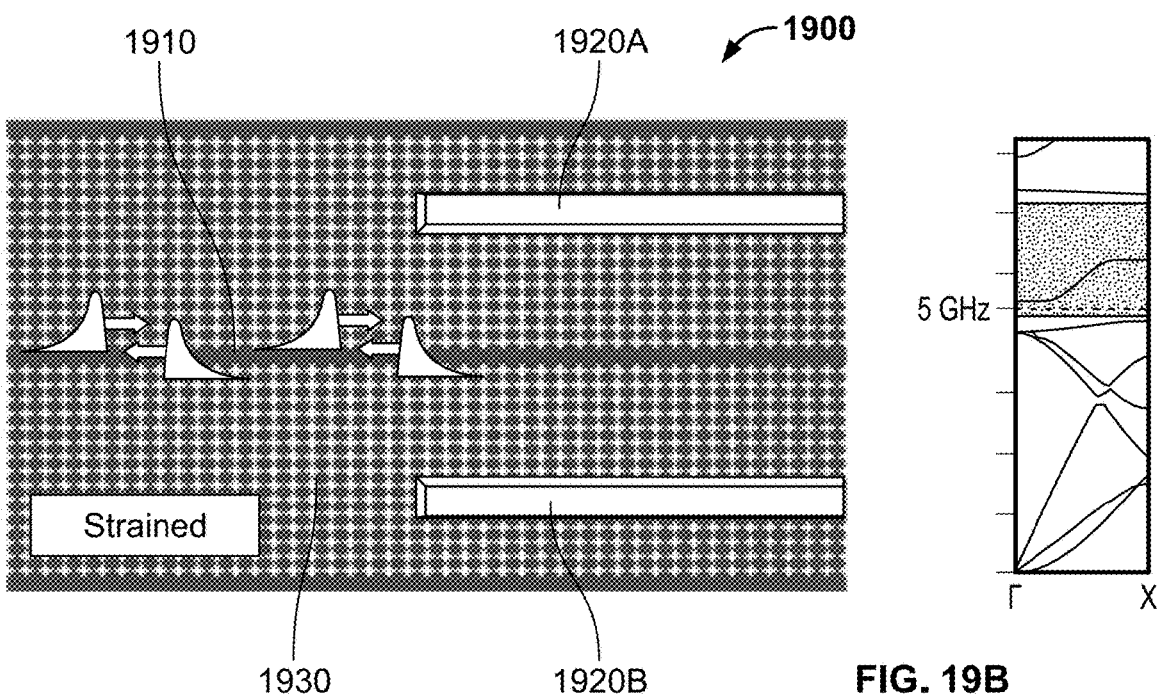

At much higher levels of strain, a reconfigurable reflectivity mirror 1900, as illustrated in FIGS. 19A-19B, can be created. The reconfigurable reflectivity mirror 1900 includes a phononic crystal waveguide 1910 and a pair of strain actuators 1920A, 1920B. With no bias applied to the pair of strain actuators 1920A, 1920B, the reconfigurable reflectivity mirror 1900 allows the phonon to pass through the phononic crystal waveguide 1910, as illustrated in FIG. 19A. When bias is applied to the pair of strain actuators 1920A, 1920B, the guided band is shifted to exclude the operating frequency. To conserve energy, an incoming phonon is reflected when it impinges on the region of the phononic crystal waveguide 1910 where the lattice is highly strained, as illustrated in FIG. 19B. Since the operating frequency remains in the bandgap, it also cannot be dissipated into the surrounding phononic crystal 1930 in other directions.

The term "reconfigurable" as used to describe the devices illustrated in FIGS. 17 through 19 may be used in two distinct senses. In a first sense, "reconfigurable" may refer to the operating wavelength. For example, the tunable MZPI 1840 may be reconfigurable in that the device can be tuned to operate with any input phononic signal operating wavelength. In a second sense, "reconfigurable" may refer to an output ratio. For example, the reconfigurable MZPI 1840 may be reconfigured in that the device can be reconfigured to provide a desired output ratio of the two input phononic signals.

Figure 20:
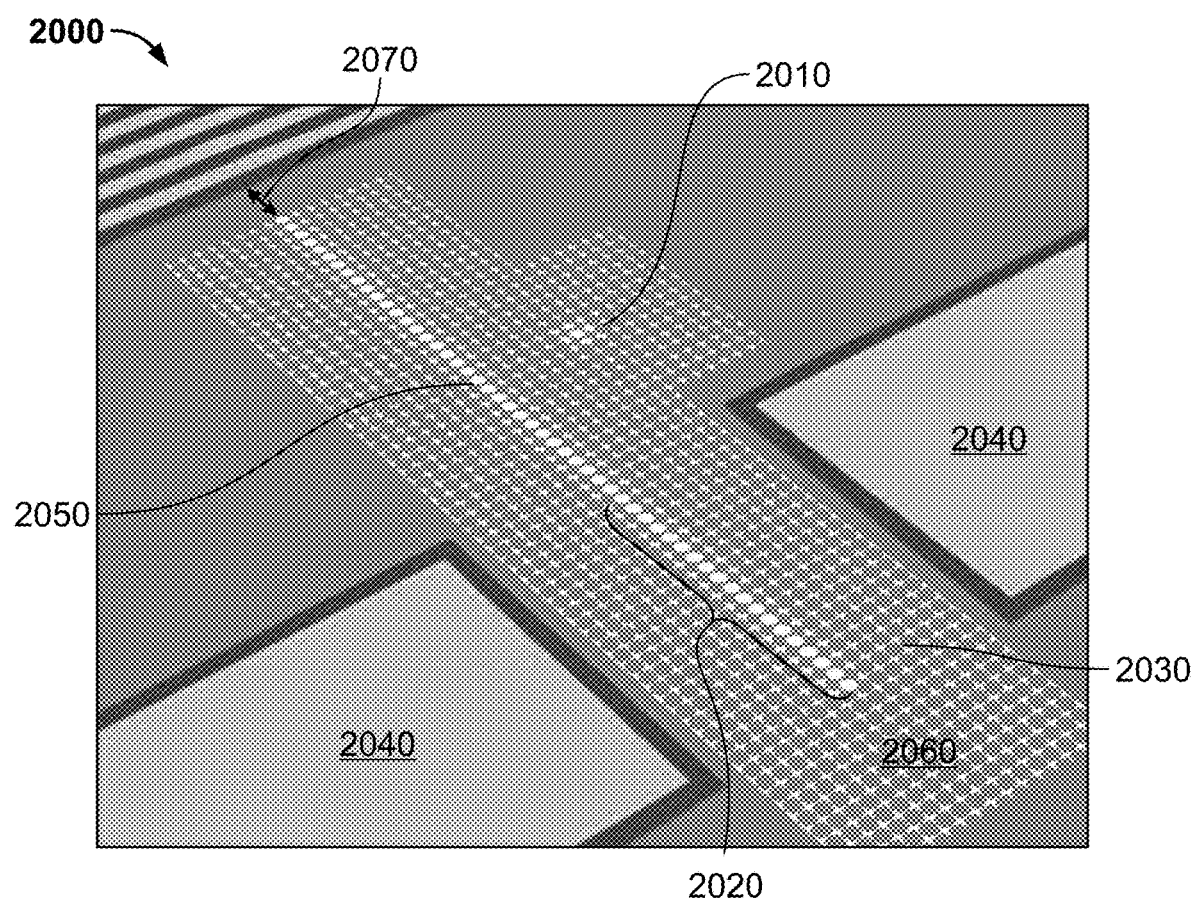
FIG. 20 illustrates a phononic memory cell in accordance with one or more embodiments of the present invention.

The phase shifting waveguide construction can be placed adjacent to a phononic nanocavity 2010 to yield a phononic memory cell 2000, as illustrated in FIG. 20. The phononic nanocavity 2010 can be used for the transfer, storage, and/or exchange of phonons with an adjacent waveguide 2050, thereby allowing on-demand storage and re-emission of phononic states. The results of Tanaka for a photonic system can be directly ported over to the present phononic systems. See Y. Tanaka et al., "Dynamic control of the Q factor in a photonic crystal nanocavity," Nature Materials, vol. 6, pp. 862-865 (2007), the contents of which are incorporated herein by reference. For a 2D phononic nanocavity 2010, the Q is determined by two factors, the intrinsic loss of the nanocavity $Q_i$ and the in-plane coupling with the waveguide $Q_e$, which combine to yield a total quality factor $Q_{tot}$ that is defined by the relation:

$$\frac{1}{Q_{tot}} = \frac{1}{Q_i} + \frac{1}{Q_e} = \frac{1+\cos\varphi}{Q_i^0} + \frac{1}{Q_e} \quad \text{(Eq. 1)}$$

where $Q_i^0$ is the intrinsic Q factor of the phononic nanocavity at zero piezoelectric bias and $\varphi$ is the phase shift induced by the passage of the phononic signal through the strained region 2020 of the phononic crystal 2030. Assuming that $Q_e \gg Q_i^0$, $Q_{tot}$ can be changed from $Q_i^0/2$ to $Q_e$ by changing $\varphi$ from 0 to $\pi$. Using the strain-based phase shifter 1700 described above, the phase difference can be tuned continuously by varying the voltage applied to the piezoelectric actuators 2040. The intrinsic quality factor of the phononic nanocavity 2010 is of the order $5 \times 10^{10}$ (see, G. S. MacCabe et al.), while the extrinsic Q can be tuned to optimize performance of the phononic memory cell 2000 through suitable choice of the spacing between the waveguide 2050 and the phononic nanocavity 2010. The phononic memory cell 2000 further includes a phononic mirror 2060 for reflecting the phonons within the phononic memory cell 2000 and a signal I/O port 2070 for coupling phonons into and out of the phononic memory cell 2000 for a read or write process.

Figure 21:
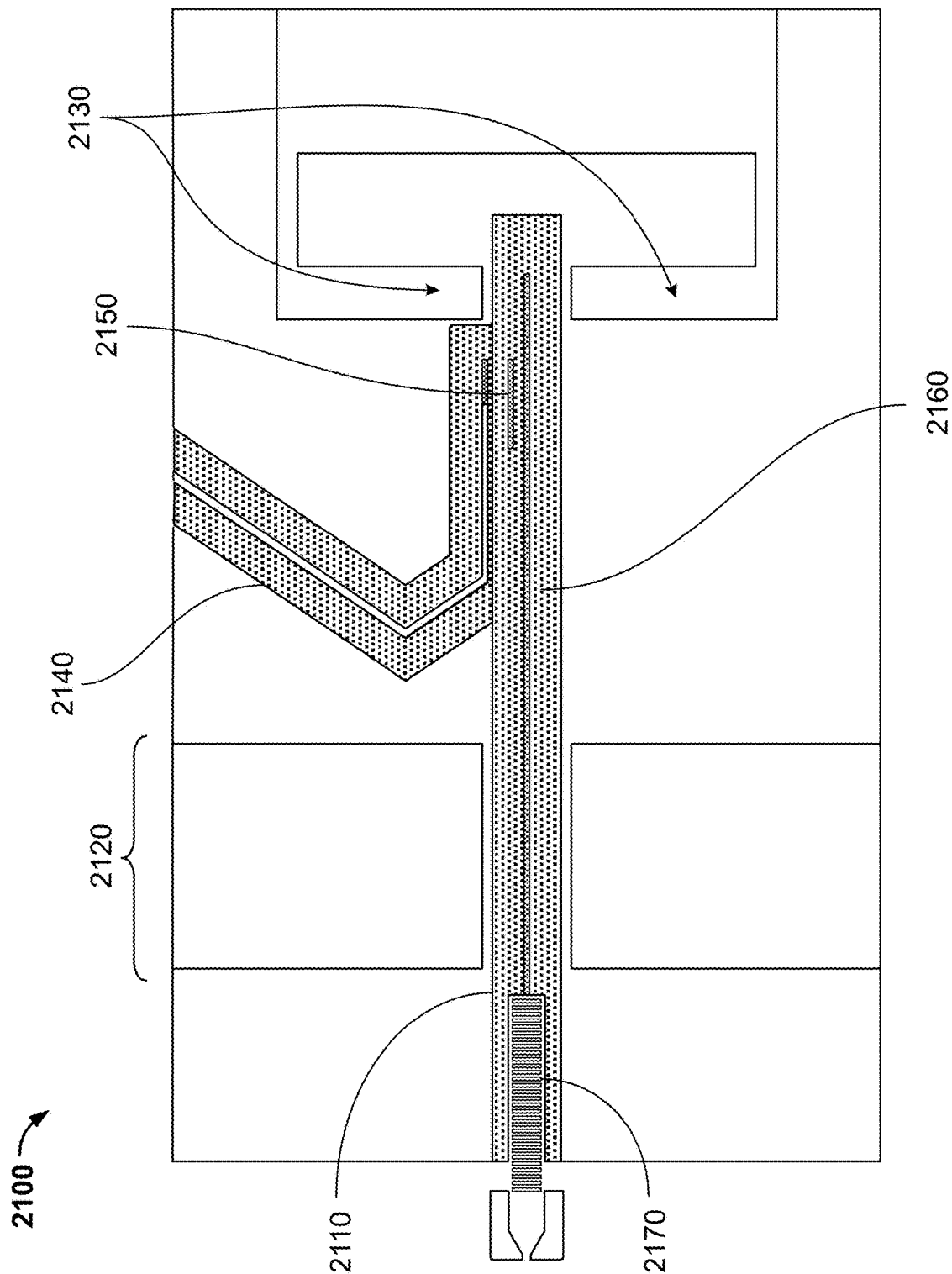
FIG. 21 illustrates an alternative phononic memory cell in accordance with one or more embodiments of the present invention.

FIG. 21 illustrates an alternative embodiment of a phononic memory cell 2100, which is read out using an optical signal. The phononic memory cell 2100 transduces a microwave frequency phonon, for example, at 5 GHz, into a photon, for example, at 194 THz, corresponding to a 1550 nm wavelength, that can be transmitted over an optical fiber. A phononic waveguide 2110 is designed to localize only a phononic excitation. A phononic signal impinging from the left travels past a first piezoelectrically-actuated phase shifter 2120, which exists to tune the phase of the input phononic signal relative to the components of the phononic memory cell 2100 to the right. After passing the first phase shifter 2120, the phononic signal propagating from left to right will become trapped in an evanescently-coupled optomechanical nanocavity 2150 due to a wave-mechanical interference condition created by tuning the bias applied to a second phase shifter 2130. As will be appreciated by those of ordinary skill in the art, the optomechanical nanocavity 2150 of the phononic memory cell 2100 corresponds to the phononic nanocavity 2010 in the phononic memory cell 2000, but includes additional design features to support interaction with the readout optical signal, as will be described below.

The dynamics of the phononic memory cell 2100 result from an interference of three waves at the left output port of the optomechanical nanocavity 2150: (1) the input phononic wave that is transmitted past the optomechanical nanocavity 2150, (2) the raw rightward-traveling output from the optomechanical nanocavity 2150, and (3) the raw leftwardtraveling output from the optomechanical nanocavity 2150. Waves (1) and (2) have a round trip propagation phase that is dependent on the state of the second phase shifter 2130, allowing for the interference between each of these waves and wave (3) to be controlled. The dynamic profile of the control voltages on the first and second phase shifters 2120, 2130 can be solved to maximize the fidelity of transfer into the optomechanical nanocavity 2150 while the state of the optomechanical nanocavity 2150 switches from its initial waveguide-coupled state to its final uncoupled state that confines phononic information in the optomechanical nanocavity 2150.

When the incoming phononic signal is trapped in the optomechanical nanocavity 2150, it will remain in the phononic state until the optomechanical nanocavity 2150 is interrogated with an optical pulse where the photon energy is equal to the resonant optical frequency of the optomechanical cavity 2150 less the energy of the resonant mechanical frequency of the optomechanical cavity 2150. The energy provided by the optical signal will convert the mechanical energy of the confined phononic information into electromagnetic energy in the optomechanical nanocavity 2150. The evanescent coupling between the optomechanical nanocavity 2150 and an output photonic waveguide 2140 is tuned so that the coupling of the optical component of the optomechanical nanocavity 2150 to the output photonic waveguide 2140 is much faster than the mechanical coupling to the output photonic waveguide 2140. Consequently, the optically-interrogated phonon in the optomechanical nanocavity 2150 will be efficiently converted into a photon in the output photonic waveguide 2140, where it can be routed off-chip into an optical fiber (not illustrated).

This transduction scheme is predicated upon a periodic array of holes patterned in the Si membrane used to form the phononic memory cell 2100. These holes constitute a simultaneous phononic and photonic crystal, i.e., an optomechanical crystal 2160, which simultaneously possesses a mechanical bandgap surrounding the frequency of the guided phononic mode, for example, at 5 GHz, and an optical bandgap surrounding the frequency of the output optical mode, for example, at 194 THz. The optomechanical nanocavity 2150 is situated within the optomechanical crystal 2160 so that it simultaneously localizes mechanical and optical signals in these frequency ranges.

Optionally, this phononic memory cell 2100 may act as a microwave photon to optical photon transducer, receiving as an input, for example, the signal from a microwave-frequency cavity, such as those found at the output of a transmon circuit. This output cavity will be capacitively terminated in an interdigital transducer 2170, which converts the electromagnetic signal of the qubit from the transmon circuit into a mechanical resonance in the phononic waveguide 2110. In this form, the transducer illustrated in FIG. 21 will transduce a qubit originating in a transmon circuit into a flying qubit in an optical fiber.

Figure 22A:
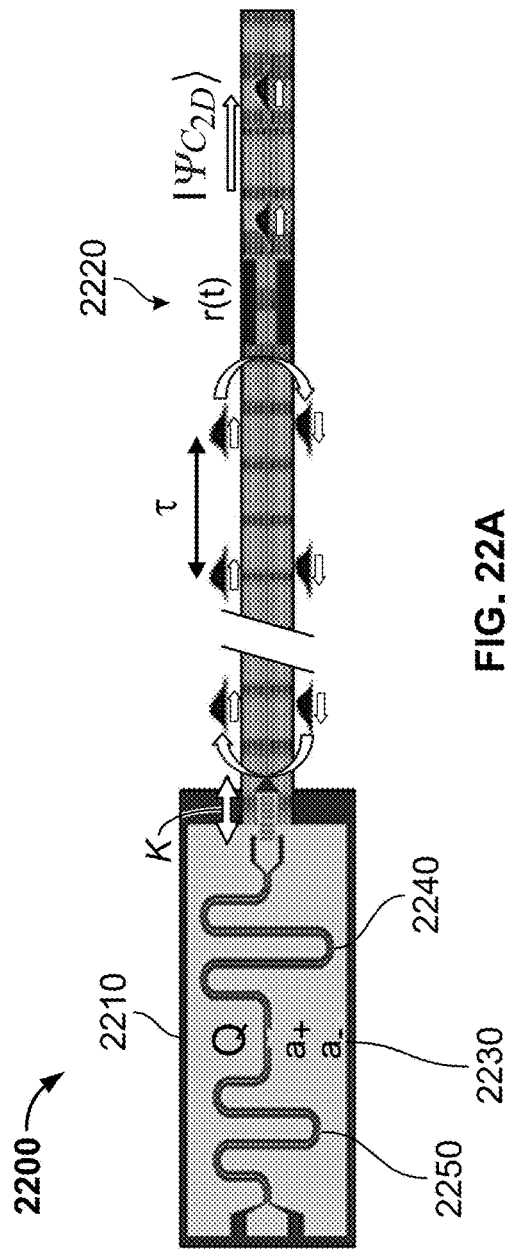
FIGS. 22A and 22B illustrate a 2D cluster state generator and its output phonon states, respectively, in accordance with one or more embodiments of the present invention.
Figure 22B:
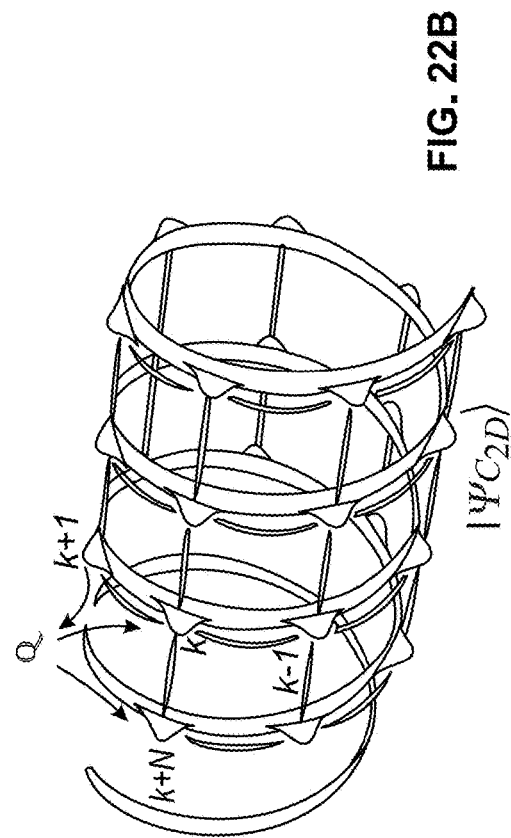

One approach to generating the desired 2D multi-particle entanglement employs a 2D cluster state generator 2200, i.e., a transmitting phononic device, with a 1D phonon cluster state generator 2210 combined with a reconfigurable phononic mirror 2220. This is illustrated in FIGS. 22A-22B, where the 1D phonon cluster state generator 2210, for example, the 1D phonon cluster state generator 1100 illustrated in FIG. 11, is augmented with a reconfigurable phononic mirror 2220, for example, the reconfigurable reflectivity mirror 1900 illustrated in FIG. 19. This approach uses the reconfigurable phononic mirror 2220 to reflect the k-th phonon back toward the transmon 2230 in the 1D phonon cluster state generator 2210. Define T to be the delay that k-th phonon experiences between when it is emitted, reflects off the reconfigurable phononic mirror 2220, and re-interacts with the transmon 2230. T is selected such that the kth phonon will re-interact with the transmon 2230 between the (k+N−1)th cycle and the (k+N)th cycle; to wit, $T=(N-\frac{1}{2})\tau$, where τ is the protocol time of the 1D phonon cluster state generator 2210. This makes the distance to the reconfigurable phononic mirror 2220 equal to vT, where v is the group velocity of the phonons. It can be shown that if the transmon 2230 is in the state $|1\rangle_Q$ when the phonon arrives back at the transmon 2230 (with the flux tuning implemented so that the transmon 2230 is coupled to the output cavity 2240 at time T), it will be resonantly coupled to the $|1\rangle_Q \to |2\rangle_Q$ transition. However, if the transmon 2230 is in the state $|0\rangle_Q$, there is no interaction. This interaction produces a controlled $\sigma^z$ gate on the kth phonon and thus the phonon is re-emitted by the output cavity 2240 but with the transmon state now entangled with it. See P.-O. Guimond et al., "Chiral quantum optics with V-level atoms and coherent quantum feedback," Physical Review A, vol. 94, art. no. 033829 (2016) and P. Lodahl et al., "Chiral quantum optics," Nature, vol. 541, no. 7638, pp. 473-480 (2017), the contents of each of which are incorporated herein by reference. This, in turn, produces entanglement with the (k+N)th emitted phonon. This process produces the cylindrical 2D cluster state illustrated in FIG. 22B. The 2D cluster state generator 2200 further includes a transmon input cavity 2250. The transmon input cavity 2250 receives a control field in the form of a microwave pulse having, for example, an energy of several microwave photons. The control field, via the transmon input cavity 2250, places the transmon 2230 in the desired initial quantum state.

Figure 23:
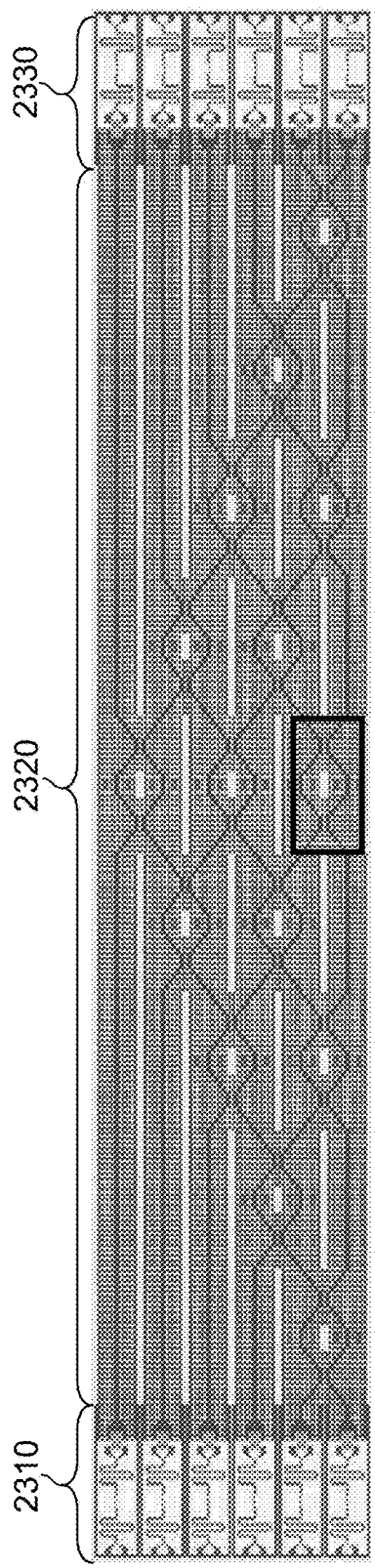
FIG. 23 illustrates a 3D cluster state generator in accordance with one or more embodiments of the present invention.

One approach to generating the desired three dimensions of entanglement is to array 2D cluster state generators, for example, the 2D cluster state generator 2200, with beamsplitter interactions, implemented, for example, with the MZPI 1840, to produce another dimension. FIG. 23 illustrates such a 3D cluster state generator 2300 with an exemplary array of six 2D cluster state generators 2310, such as the 2D cluster state generator 2220 (the delay lengths have been omitted for ease of illustration). While the illustrated embodiment of the invention includes six 2D cluster state generators 2310, other embodiments of the present invention may have fewer than six 2D cluster state generators, though more (potentially far more) 2D cluster state generators may be employed. The outputs of the six 2D cluster state generators 2310 are then input into an array of MZPIs 2320 as illustrated in FIG. 23, wherein a single MZPI is annotated with a box. The array of MZPIs 2320 generate an arbitrary unitary transformation from the six inputs modes to the six output modes, in what will be termed a "linear programmable nanophononic processor" (LPNP). The output of the MZPIs 2320 is feed to an array of phonon detector systems 2330, such as the phonon detector device 1500. The array of MZPIs 2320 in this LPNP can create another degree of entanglement between the modes of the independent waveguides. Therefore, an array of devices arranged as illustrated in FIG. 23 will take the dimensionality of entanglement from 2 to 3.

Theory of Operation

A highly-quantum non-Gaussian state is an essential resource for continuous variable (CV) entanglement distillation, CV quantum error correction, and cluster-state quantum computation. See, J. Eisert et al., "Distilling Gaussian states with Gaussian operations is impossible," Physical Review Letters, vol. 89, article no. 137903 (2002); J. Niset et al., "No-go theorem for Gaussian quantum error correction," Physical Review Letters, vol. 102, article no. 120501 (2009); and A. P. Lund et al., "Fault-tolerant linear optical quantum computing with small-amplitude coherent states," Physical Review Letters, vol. 100, article no. 030503 (2008), respectively, the contents of each of which are incorporated herein by reference.

Because the transmon discrete variable (DV) qubit system is highly anharmonic (nonlinear) and the conversion chain of various embodiments of the present invention are efficient, various embodiments of the present invention will closely resemble a simple Jaynes-Cummings Hamiltonian system where a harmonic oscillator (CV telecom optical field) is coupled to an atom (DV transmon qubit system). Consequently, various embodiments of the present invention can generate the desired non-Gaussian states in the flying telecom optical field by either (1) transducing the arbitrarily-controllable microwave transmon qubit to the flying optical field or (2) scattering a flying coherent-state optical-field input from various embodiments of the present invention. For successful production of these desired non-Gaussian states (i.e., a combination of strong non-Gaussianity and strong negativity of Wigner function) for various CV protocols, coherence among the telecom photon, the phonon, and the microwave photon is necessary. The various embodiments of the present invention guarantee this strong coherent coupling through piezoelectric transduction and optomechanical transduction in the optomechanical crystal resonator 110.

This paradigm of generating non-Gaussian states using the hybrid DV (microwave transmon qubit) and CV (flying optical field) approach of various embodiments of the present invention ensures a deterministic method, unlike the conventional probabilistic photon subtraction via single photon detection. See, U. L. Andersen et al., "Hybrid discrete- and continuous-variable quantum information," Nature Physics, vol. 11, pp. 713-719 (2015), the contents of which are incorporated herein by reference. This deterministic non-Gaussian state generation is essential for efficient CV-protocols, thereby avoiding the traditional large overhead in an all-optical quantum computation system.

One can quantify the generated non-Gaussian state using the generally accepted Genoni's non-Gaussianity measure (see, M. G. Genoni and M. G. Paris, "Quantifying non-Gaussianity for quantum information," Physical Review A, vol. 82, article no. 052341 (2010), the contents of which are incorporated herein by reference):

$$\delta[\rho] = S(\tau) - S(\rho), \quad \text{(Eq. 2)}$$

where $\tau$ is the Gaussian state (i.e., a thermal state with appropriate squeezing and displacement transformation) that has the same first and second moment as the original state $\rho$, and $S(\rho) = -\text{Tr}[\rho \log \rho]$ is the von Neumann entropy. This information-theoretic non-Gaussianity measure can readily be used to estimate the performance for a CV quantum information protocol with non-Gaussian states. It is noteworthy that one must supplement the non-Gaussianity with definite quantumness through the negativity of the Wigner function from the state, in order to measure the usefulness of the non-Gaussian state. These quantities are both calculable from a comprehensive model and measurable through experiments.

The CV-DV hybrid system of various embodiments of the present invention, with its exceptionally strong coupling between the flying optical field (CV) and the versatile and controllable transmon qubit (DV), will efficiently generate useful non-Gaussian states for various CV quantum information processes.

To understand the fundamental working principles and the limitations of the various embodiments of the present invention device and their operation when connected to a microwave qubit, it is crucial to build a sufficiently accurate theoretical model. The following adopts a formalism of quantum master equation-based input-output theory that is suitable for all of the microwave, the phonon, and the optical photon baths and the quantum noises from them. See, C. W. Gardiner and M. J. Collet, "Input and output in damped quantum systems: quantum stochastic differential equations and the master equation," Physical Review A, vol. 31, pp. 3761-3774 (1985), the contents of which are incorporated herein by reference. In Schrödinger picture, the master equation is expressed as:

$$\dot{\rho} = -\frac{i}{\hbar}[H + H_I, \rho] + \sum_i \left( L_i \rho L_i^\dagger - \frac{1}{2} L_i^\dagger L_i \rho - \frac{1}{2} \rho L_i^\dagger L_i \right), \quad \text{(Eq. 3)}$$

where $\rho$ is the density operator, $\hbar$ is the Planck's constant, H is the free Hamiltonian, $H_I$ is the interaction Hamiltonian, and $L_i$'s are the Lindblad operators. The first and the second terms on the right-hand side of Equation 3 explain the unitary and the non-unitary evolution, respectively. The Lindblad jump operators correspond to various decoherence (decay) mechanisms. Equivalently, one can express a Heisenberg picture master equation for any time-evolving quantum operator Q as:

$$\dot{Q} = -\frac{i}{\hbar}[Q, H + H_I] + \sum_i \left( L_i^\dagger Q L_i - \frac{1}{2} L_i^\dagger L_i Q - \frac{1}{2} Q L_i^\dagger L_i \right). \quad \text{(Eq. 4)}$$

Then, one can derive a stochastic differential equation for an observable by taking the expectation of Equation 4.

The second-quantized microwave field with a quantum noise from the QIS units will be used as the system input for various embodiments of the present invention. The free propagating optical field in the optical waveguide will be used as the system output for various embodiments of the present invention. The corresponding Hamiltonians can be expressed as:

$$H = \hbar \omega_d a_{in}^+ a_{in} + \hbar \omega_b b^+ b + \hbar \omega_c c^+ c + \hbar \omega_d d_{out}^+ d_{out} \text{ and} \quad \text{(Eq. 5a)}$$

$$H_I = \hbar \kappa (a_{in} b^+ + a_{in}^+ b) + \hbar g(a^+ c + ac^+) + \hbar \eta (d_{out} c^+ + d_{out}^+ c), \quad \text{(Eq. 5b)}$$

where $\omega_b$, $\omega_c$ are the resonant frequencies of the phonon and photon modes in the optomechanical crystal resonator 110, respectively, b, c are the annihilation operators for the phonon and photon modes in the optomechanical crystal resonator 110, respectively, K, n are the coupling rates for the input and the output, and g is the coupling rate between the phonon and photon modes in the optomechanical crystal resonator 110. Here, din is the microwave photon input quantum operator with frequency $\omega_a$ and $d_{out}$ is the outgoing telecom flying photon's quantum operator with frequency $\omega_d$.

The expected decoherence channels are modeled through the Lindblad operators:

$$L_1 = \sqrt{\gamma_b} b \text{ and} \quad \text{(Eq. 6a)}$$

$$L_2 = \sqrt{\gamma_c} c, \quad \text{(Eq. 6b)}$$

which describe the phonon and photon loss channels in the optomechanical crystal resonator 110 with the corresponding loss rates $\gamma_b$, $\gamma_c$. Also, one can model the loss in the input and the output using additional Lindblad operators:

$$L_3 = \sqrt{\gamma_a} a_{in} \text{ and} \tag{Eq. 7a}$$

$$L_4 = \sqrt{\gamma_d} d_{out}, \tag{Eq. 7b}$$

with the corresponding loss rates $\gamma_a$, $\gamma_d$. After applying these operators in the master equation (Equation 3), the resulting differential equations will successfully predict the quantum states of the phonon and the photon modes in the optomechanical crystal resonator 110 as well as the noise and the measurement characteristics. The solutions are obtained by solving the differential equations with appropriate initial conditions.

A more comprehensive treatment of the input noise requires including all bath modes with other frequencies as well. The above Markovian master equation allows the use of an input noise operator defined as:

$$a_{in}(t) = \frac{1}{\sqrt{2\pi}} \int_{-\infty}^{\infty} d\omega e^{-i\omega(t-t_0)} a_{in}(\omega), \tag{Eq. 8}$$

where $a_{in}(\omega)$ is the annihilation operator of a bath mode at frequency $\omega$. Using this formalism, one arrives at the Ito quantum stochastic differential equation (see, C. W. Gardiner and P. Zoller, "Quantum noise," Springer (Berlin, 2004), the contents of which are incorporated herein by reference):

$$dQ = -\frac{i}{\hbar}[Q, H+H_I]dt + \tag{Eq. 9}$$
$$\gamma((N+1)D[c^+]Q + ND[c]Q)dt - \sqrt{\gamma}([Q, c^+]dB(t) - dB^+(t)[a, c]),$$

where $$D[c]Q = cQc^+ - (\tfrac{1}{2})(c^+cQ+Qc^+c) \tag{Eq. 10a}$$

is the Lindblad superoperator, $$B(t) = \int_0^t a_{in}(t')dt' \tag{Eq. 10b}$$

is the Wiener process, c is the annihilation operator of a system mode that directly exchanges the excitation quanta with the bath modes, and Q is an arbitrary quantum operator of the system. This comprehensive treatment of quantum noises from the bath allows the accurate prediction of the output field's temporal noise.

It is critical to identify the loss mechanisms and their corresponding loss rates in the entire system of the microwave qubit and quantum transducer device 100, traveling microwave photon, traveling microwave phonons, optomechanical crystal resonator 110 phonon and photon cavity modes, and the output optical photon mode. Moreover, the coupling strengths among the various quantized particles (microwave photon, phonon, and optical photons) are essential elements in the quantum master equation-based input-output formalism. Fortunately, all of these parameters can be determined through independent experiments and inferences therefrom. Once all unitary Hamiltonian elements (free rotation, resonant frequency detuning, and couplings) and non-unitary Lindblad operator elements (losses) are identified, a comprehensive fully-quantum simulation can be performed numerically using the widely-used QUTIP numerical package.

A prominent figure of merit is the fidelity of the produced output telecom photon state. The quantum master equation-based input-output formalism provides the desired fidelity by taking an inner product between the desired input photon state (presumably the same as the QIS microwave photon) and the simulated output telecom photon state driven by the chains of conversions starting from the QIS microwave photon. Thus, the formalism will be able to produce the expected fidelity within the boundary of the experimentally achievable parameters.

The theory of operation for the strain-based phase shifter 1700, the MZPI 1840, and the reconfigurable reflectivity mirror 1900, based upon two principal acousto-mechanical effects, are described next. A phonon in a phononic crystal waveguide will possess a wavevector $k=\Omega/v$, which is defined by the angular frequency of the excitation, $\Omega$, and the speed of sound in the medium, v. The speed of sound is a function of the density of the material, $\rho$, and the elasticity tensor, $\vec{c}$, and can be determined by solving the tensor stress wave equation in a solid-state system for the waveguide:

$$\vec{\nabla} \cdot (\vec{c}(\vec{r}):\vec{\nabla}_s \vec{u}(\vec{r})) = -\rho\Omega^2 \vec{u}(\vec{r}), \tag{Eq. 11}$$

where $\vec{u}(\vec{r})$ is the particle displacement vector field at position $\vec{r}$, $\Omega$ is the angular frequency of the acoustic field, $\vec{\nabla}_s \equiv (\vec{\nabla} + \vec{\nabla}^T)/2$ is the symmetric gradient operator, the colon denotes the double scalar tensor product, and $\vec{c}$ is the fourth rank elasticity tensor. This tensor stress wave equation Eq. 11 can be solved for arbitrary waveguide geometries and materials using, for example, the finite element method with periodic boundary conditions or plane wave expansion methods.

Two distinct velocity modulation effects are associated with a change in the strain of the phononic crystal waveguide that produce a change in the propagation constant as:

$$\Delta k = -(k/v)\Delta v, \tag{Eq. 12a}$$

as well as a change in length:

$$\Delta L = s_{\vec{k}} L, \tag{Eq. 12b}$$

which affects the phase accumulated by a wave as it traverses the phononic crystal waveguide ($s_{\vec{k}}$ is the Voigt contracted strain projected in the direction of wave propagation). For small perturbative strain fields, such as those employed in the strain-based phase shifter 1700 and the MZPI 1840, the associated change in phase for the wave is:

$$\Delta\varphi = \Delta(kL) = L(\Delta k) + k(\Delta L). \tag{Eq. 13}$$

The first velocity modulation effect with stress comes from an anharmonic perturbation of the elasticity tensor. This modification of the elasticity tensor, $\vec{c}(\vec{r})$, can be described by a strain free tensor, $\vec{c}^{(0)}$, in addition to a higher order tensor, $\vec{c}^{(1)}$, that describes spatially-dependent modification of $\vec{c}(\vec{r})$ in proportion to the various strain components as:

$$\vec{c}(\vec{r}) = \vec{c}^{(0)} + \vec{c}^{(1)} : \vec{s}(\vec{r}), \tag{Eq. 14}$$

where $\vec{c}^{(1)}$ is a sixth-order tensor in the Hookean approximation for the energy of deformation of a body. This approximation amounts to a Taylor expansion of the elasticity, analogous to the nonlinear electro-optic tensor that describes the dielectric response of an optical material to an applied electric field. For a phononic crystal waveguide made of a material such as silicon with point group m$\bar{3}$m, the 729 components of the sixth-order tensor reduce to 6 experimentally determined independent coefficients.

The second velocity modulation effect in which strain interacts with phonon velocity comes from the deformation of the cross-section of the phononic crystal waveguide. This deformation of the cross-section of the phononic crystal waveguide modifies the wavevector of the phonon through the acousto-mechanical moving boundary effect, in analogy to the optomechanical moving boundary effect in photonics.

Applications

In a quantum network, the end nodes are expected to perform frequent non-local quantum operations for distributing, maintaining, and processing quantum information jointly among the nodes. The core resource that enables such quantum-information-sharing activities is the entanglement between computational nodes. For example, the entangled qubits (ebits) are necessary for teleportation, which will be the backbone for the network's information flow.

Entanglement among the end nodes is established by distributing the entangled quantum information, for example, ebits, among the nodes. Degradation of entanglement occurs due to the loss in qubit-transporting channels. Entanglement also degrades over time due to the decoherence in the end nodes. One must monitor such degradation of entanglement by facilitating test ebits and periodically performing EPR-Bell measurements on the test ebits. If degradation to an unacceptable degree is found, one must redistribute, or reinforce, the ebits.

It is crucial to accomplish the "on-demand" internode entanglement in order to run the quantum network efficiently. Entanglement is managed via three steps: (1) generate ebits, (2) transfer the ebits separately to individual nodes, and (3) keep the ebits ready to be used by the computing nodes. Although the various embodiments of the present invention may not directly help the first step, these embodiments can help the second and third steps. Specifically, various embodiments of the present invention, with their efficient qubit transduction from the flying ebit photons to the phonon buffer, will reduce the entanglement degradation during the transfer stage. Further, the optomechanical crystal resonator 110 will enhance the preservation of entanglement significantly. Consequently, the quantum transducer device 100 will substantially reduce the demand for fast ebit generation.

The first quantum computers are likely to use superconducting qubits. Already, Google [bristlecone], IBM [experience], and D-wave [dwave] have many-qubit systems operating and available for limited use by the public. The gate-model of quantum computing espoused by IBM and Google will eventually allow for generalized quantum computing applications. As superconducting systems, these are inherently cryogenic systems. Communication between nodes operating in a cryogenic environment will likely require optical communication.

In general, if quantum computing is realized in a cryogenic environment with superconducting qubits, it faces several general concerns. First, all cryogenic implementations of qubits have bit energies in the microwave range, which is partially why they are in cryogenic environments. However, a 20 GHz microwave photon is energetically equivalent to a thermal bath of 1 K and will be swamped by the thermal background if used for communication out of the cryogenic environment of a cryostat. Thus, up-conversion to higher frequencies, for example, optical frequencies, is needed for quantum networking and distribution of quantum entanglement. Thus, various embodiments of the present invention support this need for up-conversion from the energy of a microwave photon.

Secondly, superconducting qubits suffer from short coherence times that are generally less than 100 μS in current state of the art systems. Thus, the long-lived, local quantum memory/buffer in the form of the optomechanical crystal resonator 110 in various embodiments of the present invention support the need for a quantum memory that is much longer lived.

The IBM and Google systems are based on a type of superconducting qubit called the "transmon," with communication between qubits mostly accomplished through superconducting resonators. Two additional types of qubits show promise at cryogenic temperatures. These are spin qubits in semiconductor quantum dots and superconducting qubits based on charge, flux, phase, etc. While spin qubits generally have longer coherence times, they are difficult to make and measure and understanding of coupling them to microwave systems is still evolving.

Figure 24:
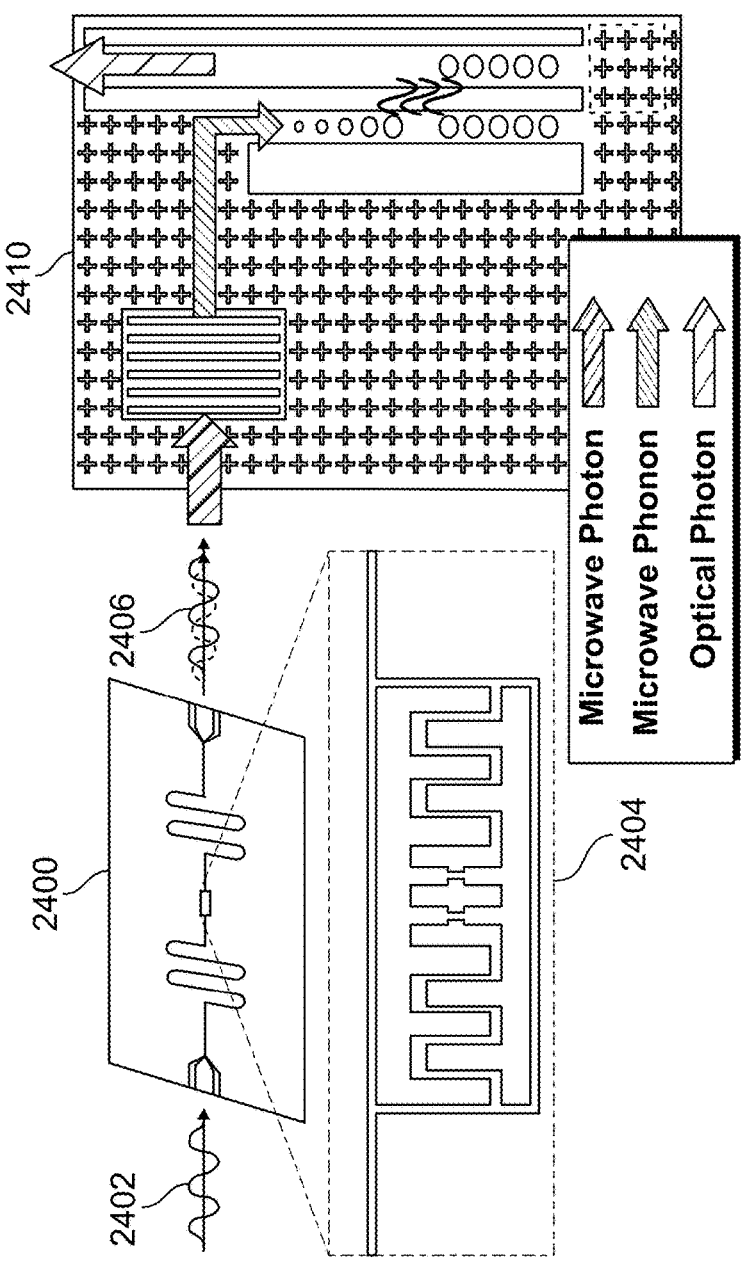
FIG. 24 illustrates a transmon microwave qubit being used as the input to a quantum transducer device in accordance with one or more embodiments of the present invention.

FIG. 24 illustrates a transmon microwave qubit 2400 being used as the input to a quantum transducer device 2410 in accordance with at least one embodiment of the present invention. The illustrated transmon microwave qubit 2400 is of the superconductor type, which includes an input 2402 for a classical microwave photon. This classical microwave photon is converted into a microwave photon qubit by the transmon superconducting metal resonator 2404. The resultant microwave photon qubit is then output at output 2406 to the quantum transducer device 2410. The illustrated quantum transducer device 2410 is the same embodiment as that illustrated in FIG. 1, though other embodiments of the present invention may be employed.

Yet another application is distributed quantum computing via two different types of microwave qubits that operate at different frequencies, connected via telecom-band flying optical qubits over an optical fiber. For example, one microwave qubit could be a superconducting microwave qubit, such as a transmon, and the other microwave qubit an electron spin resonance in a silicon quantum dot. See, A. Corna et al., "Electrically driven electron spin resonance mediated by spin-valley-orbit coupling in a silicon quantum dot," Nature Partner Journals Quantum Information, vol. 4, article no. 6 (2018), the contents of which are incorporated herein by reference. It is likely that these two microwave qubits will not use the same carrier frequency for the quantum information, perhaps separated by several GHz; thus, this type of application requires microwave frequency conversion on either end of the optical fiber. Quantum transducer devices in accordance with various embodiments of the present invention can implement this required microwave frequency conversion.

In still another application, a microwave qubit-based quantum computer uses a non-local memory, for example, a phonon memory qubit, where the quantum computer is connected to the non-local memory via an optical fiber network. A first quantum transducer device transduces the microwave photon output of the microwave qubit-based quantum computer to a flying optical qubit in an optical fiber, while a second quantum transducer device transduces this flying optical qubit to the non-local memory. As will be appreciated by those of ordinary skill in the art, this process is reversed when the microwave qubit-based quantum computer retrieves data from the non-local memory.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A device comprising:
a phononic crystal, the phononic crystal including:
a phononic beam splitter, the phononic beam splitter adapted to receive first and second phononic input signals, to couple approximately 50% of the first phononic signal to each of first and second phononic beam splitter outputs, and to couple approximately 50% of the second phononic signal to each of first and second phononic beam splitter outputs;
a first phononic phase shifter, the first phononic phase shifter coupled to the first phononic beam splitter output and adapted to receive a first phononic beam splitter output signal therefrom, the first phononic phase shifter adapted to induce a first phase shift in the first phononic beam splitter output signal, and to couple the phase shifted first phononic beam splitter output signal to a first phononic phase shifter output;
a second phononic phase shifter, the second phononic phase shifter coupled to the second phononic beam splitter output and adapted to receive a second phononic beam splitter output signal therefrom, the second phononic phase shifter adapted to induce a second phase shift in the second phononic beam splitter output signal, and to couple the phase shifted second phononic beam splitter output signal to a second phononic phase shifter output; and
a phononic beam combiner, a first input to the phononic beam combiner coupled to the first phononic phase shifter output and adapted to receive the first phase shifted first phononic beam splitter output signal therefrom, a second input to the phononic beam combiner coupled to the second phononic phase shifter output and adapted to receive the second phase shifted second phononic beam splitter output signal therefrom, the phononic beam combiner adapted to couple a first portion of the first phase shifted first phononic beam splitter output signal to a first phononic beam combiner output and a remainder of the first phase shifted first phononic beam splitter output signal to a second phononic beam combiner output, and to couple a first portion of the second phase shifted second phononic beam splitter output signal to the first phononic beam combiner output and a remainder of the second phase shifted second phononic beam splitter output signal to the second phononic beam combiner output.

2. The device of claim 1, wherein each of the first and second phononic phase shifters includes:
a phononic crystal waveguide; and
at least one strain actuator, each of the at least one strain actuator adapted to induce a strain in the phononic crystal waveguide, the induced strain in the phononic crystal waveguide adapted to induce a corresponding phase shift in a phononic signal carried by the phononic crystal waveguide.

3. The device of claim 2, wherein the phase shift is caused by at least one of hyperelasticity or a moving boundary effect.

4. The device of claim 1,
wherein the device implements a reconfigurable Mach-Zehnder phonon interferometer function.

5. The device of claim 1,
wherein the device is adapted to couple approximately 50% of the first phononic input signal to each of the first and second phononic beam combiner outputs;
wherein the device is adapted to couple approximately 50% of the second phononic input signal to each of the first and second phononic beam combiner outputs; and
wherein the device implements a reconfigurable beam mixer function.

6. The device of claim 1,
wherein the device is adapted to couple approximately 50% of the first phononic input signal to each of the first and second phononic beam combiner outputs; and
wherein when no second phononic input signal is present, the device implements a reconfigurable beam splitter function.

7. The device of claim 1,
wherein when no second phononic input signal is present, the device implements a reconfigurable beam splitter function.

8. The device of claim 1,
wherein the device is adapted to couple approximately 100% of the first phononic input signal to the first phononic beam combiner output and approximately 0% of the first phononic input signal to the second phononic beam combiner output;
wherein the device is adapted to couple approximately 100% of the second phononic input signal to the first phononic beam combiner output and approximately 0% of the second phononic input signal to the second phononic beam combiner output, and
wherein the device implements a reconfigurable beam combiner function.

* * * * *